United States Patent
Onishi

(10) Patent No.: US 8,617,911 B2
(45) Date of Patent: Dec. 31, 2013

(54) METHOD FOR FORMING COATING FILM ON FACET OF SEMICONDUCTOR OPTICAL DEVICE

(75) Inventor: Yutaka Onishi, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 5 days.

(21) Appl. No.: 13/359,604

(22) Filed: Jan. 27, 2012

(65) Prior Publication Data

US 2012/0214265 A1 Aug. 23, 2012

(30) Foreign Application Priority Data

Feb. 21, 2011 (JP) .................................. 2011-034700

(51) Int. Cl.
*H01L 21/00* (2006.01)

(52) U.S. Cl.
USPC .................................. 438/28; 438/26; 438/22

(58) Field of Classification Search
USPC ...................................................... 438/26, 28
See application file for complete search history.

(56) References Cited

U.S. PATENT DOCUMENTS

| | | | |
|---|---|---|---|
| 2010/0008391 A1* | 1/2010 | Nakagawa et al. | 372/45.011 |
| 2010/0142049 A1* | 6/2010 | Sawabe et al. | 359/487 |
| 2011/0116526 A1* | 5/2011 | Sorimachi et al. | 372/46.012 |

FOREIGN PATENT DOCUMENTS

JP 2007-123374 5/2007

* cited by examiner

*Primary Examiner* — Charles Garber
*Assistant Examiner* — Brigitte Paterson
(74) *Attorney, Agent, or Firm* — Smith, Gambrell & Russell, LLP

(57) ABSTRACT

The method includes the steps of preparing an epitaxial wafer by forming a multilayer semiconductor structure on a main surface of a substrate; forming stripe electrodes and bonding pads on the multilayer semiconductor structure with the bonding pads being respectively electrically connected to the stripe electrodes; forming a projection portion on the multilayer semiconductor structure; forming laser diode (LD) bars by cutting the epitaxial wafer; arranging the LD bars on a support surface such that a side surface thereof is oriented normal to the support surface, and disposing spacers between the LD bars; and forming a coating film on the side surface. The projection portion has a height, measured from the main surface of the substrate, greater than a height of the stripe electrodes. Furthermore, the laser diode bar has at least one projection portion.

11 Claims, 22 Drawing Sheets

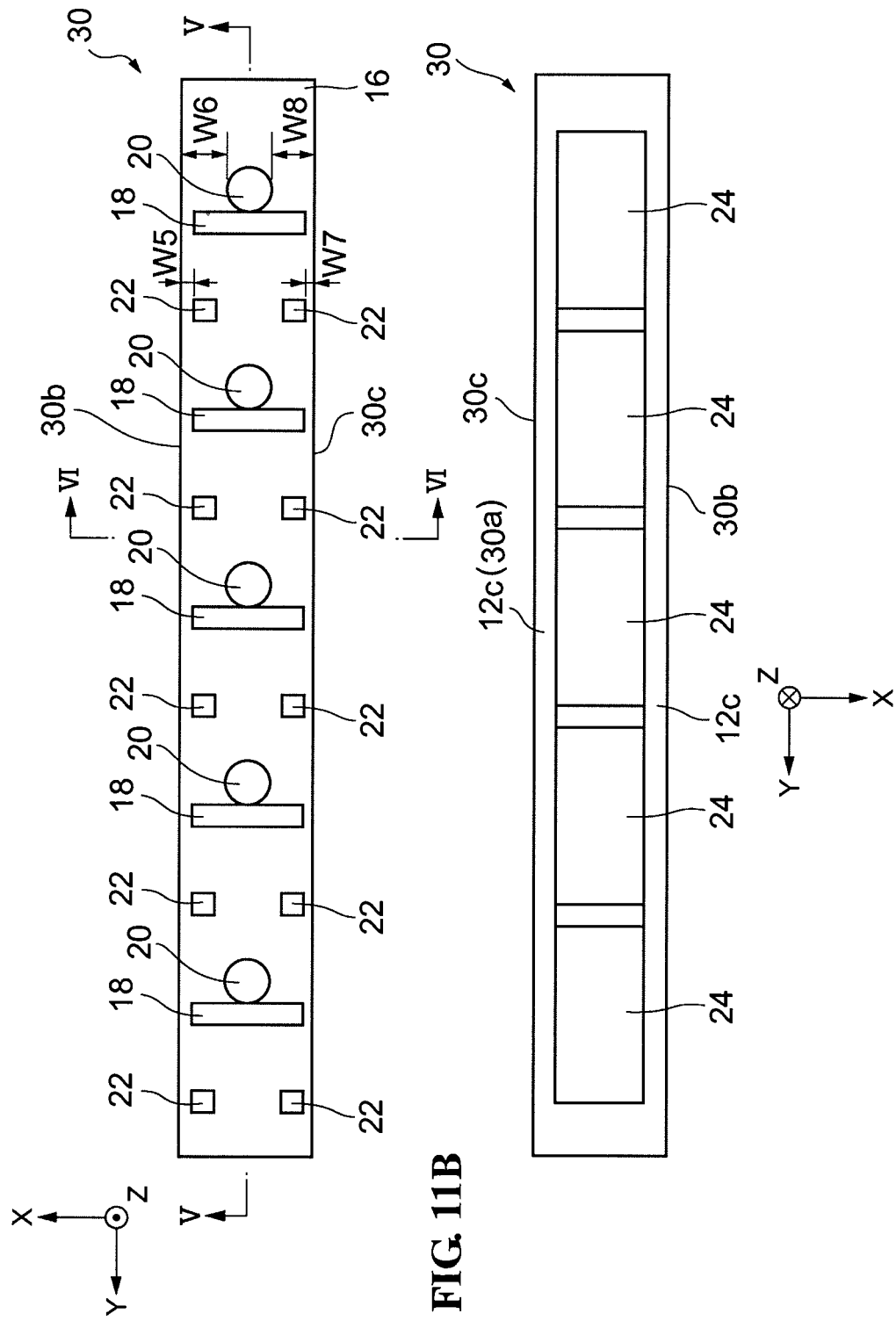

METHOD FOR FORMING COATING FILM ON FACET OF SEMICONDUCTOR OPTICAL DEVICE

BACKGROUND OF THE INVENTION

1. Field of the Invention

The present invention relates to a method for forming a coating film on a facet of a semiconductor optical device.

2. Description of the Related Art

Japanese Unexamined Patent Application Publication No. 2007-123374 discusses a method for forming a coating film on an end facet of a laser diode (LD) bar. In the coating-film forming method discussed in this document, a multilayer semiconductor structure including an active layer is first formed on a semiconductor substrate. Next, the semiconductor substrate is cleaved so that LD bars are formed. Subsequently, the LD bars are arranged with their cleaved facets facing upward, and spacers are disposed between the neighboring LD bars. Then, a coating film is formed on the cleaved facet of each LD bar. The thickness of each spacer is smaller than or equal to the width of each LD bar in the direction perpendicular to the cleaved facet.

SUMMARY OF THE INVENTION

For the purpose of adjusting the ratio between the intensity of laser light emitted from the front facet of a semiconductor laser and the intensity of laser light emitted from the back facet of the semiconductor laser to a desired value and also for the purpose of protecting the laser-light emission end surfaces, coating films are formed on the end facets of the semiconductor laser. The following is one example of a coating-film forming method. Specifically, a plurality of semiconductor layers including an active layer are first formed on a semiconductor wafer (substrate). The semiconductor wafer formed with the plurality of semiconductor layers includes a plurality of regions in which semiconductor lasers are formed (hereinafter, named as semiconductor laser region). Next, stripe shape electrodes are respectively formed in the semiconductor laser regions on the wafer. Subsequently, the wafer is cleaved in a direction perpendicular to the longitudinal direction of the stripe electrodes. Thus, LD bars each having a plurality of semiconductor lasers are formed. FIG. 20A is a plan view of one of LD bars 100. FIG. 20B is a cross-sectional view taken along line X-X in FIG. 20A. Each LD bar 100 includes a substrate 102, a plurality of semiconductor layers 104 stacked on the substrate 102, an insulating film 116 formed on the semiconductor layers 104, a plurality of stripe electrodes 106, and a plurality of bonding pads 108 for injecting current to the respective semiconductor lasers through the stripe electrodes 106. Furthermore, as shown in FIG. 20B, an electrode 110 is formed on the back surface of the substrate 102. The LD bar 100 has end facets 100a and 100b that are formed by cleaving.

Subsequently, as shown in FIG. 21, the a plurality of LD bars 100 are arranged on a flat support surface 112 such that the end facets 100a (or 100b) face upward. In order to avoid an inability to separate the neighboring LD bars 100 from each other after a coating film is formed on the end facets 100a (or 100b), spacers 114 are disposed between the neighboring LD bars 100. The spacers 114 are, for example, long plate-like components composed of silicon. As discussed in Japanese Unexamined Patent Application Publication No. 2007-123374 mentioned above, the spacers 114 each have a thickness Ta that is smaller than or equal to a width Tb of each LD bar 100. The width Tb of LD bar 100 is a distance between the end facet 100a and 100b which is corresponding to a length of a laser cavity. After this step, forces are applied, by clamping or the like, to the LD bars 100 from opposite sides thereof so as to prevent the LD bars 100 from falling off during a coating-film forming process. While maintaining this state, a coating film is formed on the end facets 100a (or 100b) of the LD bars 100.

However, the above-described coating-film forming method has the following problems. In recent years, semiconductor lasers having higher frequency modulation characteristics are in demand. In order to meet such a demand, the cavity length of semiconductor lasers has been reduced. If the width Tb of each LD bar 100 is to be reduced so as to achieve a shorter cavity length of a semiconductor laser, the thickness Ta of each spacer 114 would inevitably need to be reduced. This leads to lower mechanical strength of the spacers 114. Thus, when force is applied to both side surfaces of the spacers 114 during the coating-film forming process, deformation, such as twisting and warping, occurs in the spacers 114, as shown in FIG. 22. As a result, the edges of the spacers 114 are pressed against the stripe electrodes 106, possibly damaging (denting) the stripe electrodes 106. If the stripe electrodes 106 are damaged (dented), the reliability of the semiconductor lasers is reduced.

A method for forming a coating film on a facet of a semiconductor optical device according to the present invention includes the steps of preparing an epitaxial wafer by forming a multilayer semiconductor structure including an active layer on a main surface of a substrate; forming a plurality of stripe electrodes and a plurality of bonding pads on the multilayer semiconductor structure of the epitaxial wafer, the stripe electrodes extending longitudinally in a first direction and being arranged in a second direction that is perpendicular to the first direction, the bonding pads being respectively electrically connected to the stripe electrodes; forming a projection portion on the multilayer semiconductor structure of the epitaxial wafer; forming a plurality of laser diode bars by cutting the epitaxial wafer in the second direction; arranging the laser diode bars on a support surface such that a side surface of the laser diode bar is oriented in a normal direction of the support surface, and disposing spacers between the laser diode bars; and forming a coating film on the side surface of the laser diode bar. In addition, the projection portion has a height measured from the main surface of the substrate, the height of the projection portion being greater than a height of the stripe electrodes. Furthermore, the laser diode bar has at least one projection portion.

In this method for forming a coating film on a facet of a semiconductor optical device, a projection portion is formed on the multilayer semiconductor structure of the epitaxial wafer. The laser diode (LD) bar may have at least one projection portion. Then, in the subsequent step of arranging the LD bars, the LD bars are arranged on the support surface such that each LD bar lies sideways with its side surface oriented in the normal direction of the support surface, that is, the LD bars are oriented in the same direction. Therefore, the projection portion on each LD bar is interposed between the multilayer semiconductor structure and the corresponding spacer. Because the height of the projection portion measured from the main surface is greater than the height of the stripe electrodes, the spacer can be prevented from coming into contact with the stripe electrodes. As a result, damages to the stripe electrodes caused by the spacer can be reduced.

Furthermore, in the aforementioned method for forming a coating film on a facet of a semiconductor optical device, the projection portion may be formed simultaneously with the formation of the bonding pad, and the projection portion and the bonding pad are preferably composed of the same material as a metallic material. Consequently, the projection portion can be readily formed without additional forming processes.

Furthermore, in the aforementioned method for forming a coating film on a facet of a semiconductor optical device, the step of preparing an epitaxial wafer may include a step of forming an insulating film on the multilayer semiconductor structure. In addition, the projection portion may be formed by etching a portion of the insulating film on the multilayer semiconductor structure.

Furthermore, in the aforementioned method for forming a coating film on a facet of a semiconductor optical device, the projection portion may have a height measured from the main surface of the substrate, the height of the projection portion being preferably smaller than or equal to a height of the bonding pads measured from the main surface. In arranging the LD bars on the support surface, if gaps are formed between the bonding pads on the LD bars and the spacers, the gas used for forming the coating film may possibly flow into the gaps and cover at least a portion of each bonding pad. In contrast, by setting the height of the projection portion smaller than or equal to the height of the bonding pads, the bonding pads and the spacers can be brought into contact with each other. Then, the surface of the bonding pad is not covered with the coating film. Therefore, a favorable electrical contact between wires and the bonding pads can be achieved when the wires are bonded on the bonding pads.

Furthermore, in the aforementioned method for forming a coating film on a facet of a semiconductor optical device, the projection portion is preferably formed with a distance from the side surface of the LD bar, the distance of the projection portion from the side surface of the LD bar being preferably shorter than a distance between the side surface of the LD bar and the bonding pad. Consequently, when the LD bars are arranged on the support surface, the upper ends of the projection portions are positioned higher than the bonding pads. With the projection portions, the edges of the spacers and the stripe electrodes can be effectively prevented from coming into contact with each other.

Furthermore, it is preferable that the aforementioned method for forming a coating film on a facet of a semiconductor optical device further includes a step of forming a groove extending in the second direction in a back surface of the substrate. Moreover, the step of forming the LD bars preferably includes cutting the epitaxial wafer into segments along the groove. Consequently, recessed portions are formed in the back surface of each LD bar. When the coating film is to be formed on the side surfaces of the LD bars, the coating film is appropriately separated along the recessed portions. In the conventional method for forming the coating film on an end facet of a semiconductor laser, spacers thinner than the LD bar are used. In this conventional method, the coating films are separated by forming uneven surfaces between the back surface of each LD bar and the spacers. In contrast, with the aforementioned method, the coating film can be separated regardless of the thickness of the spacers, thereby allowing for the use of thicker spacers. Consequently, the mechanical strength of the spacers is increased so that deformation thereof is reduced, and damages to the stripe electrodes caused by the spacers can be further reduced.

Furthermore, in the aforementioned method for forming a coating film on a facet of a semiconductor optical device, the groove preferably has a depth of 30 µm or smaller. By limiting the depth of the groove in this manner, the mechanical strength of the epitaxial wafer prior to being segmented into a plurality of LD bars can be appropriately maintained.

Furthermore, in the aforementioned method for forming a coating film on a facet of a semiconductor optical device, the projection portion is preferably formed with a distance from the side surface of the LD bar, the distance of the projection portion from the side surface of the LD bar being substantially equal to a distance between the side surface of the LD bar and a sidewall of the groove. Consequently, when the LD bars are arranged on the support surface in the step of arranging the LD bars, the height of the recessed portion from the support surface can be set substantially equal to the height of the projection portion, whereby the LD bars can be stably supported in position.

Furthermore, in the aforementioned method for forming a coating film on a facet of a semiconductor optical device, the LD bar may have a width smaller than or equal to 200 µm in a direction perpendicular to the second direction. When the LD bars have a relatively small width, the spacers need to be reduced in thickness, causing the spacers to deform easily. The aforementioned method for forming a coating film on a facet of a semiconductor optical device is especially advantageous in such a case. Even when the LD bars have such a relatively small width, the spacers can be prevented from coming into contact with the stripe electrodes, thereby reducing damages to the stripe electrodes caused by the spacers.

BRIEF DESCRIPTION OF THE DRAWINGS

FIGS. 11A and 11B illustrate the step of forming the LD bar, FIG. 11A being a diagram showing the LD bar formed in this step, as viewed from the insulating-film side, FIG. 11B being a diagram showing the LD bar, as viewed from the back side thereof.

DESCRIPTION OF THE PREFERRED EMBODIMENTS

Figure 1:
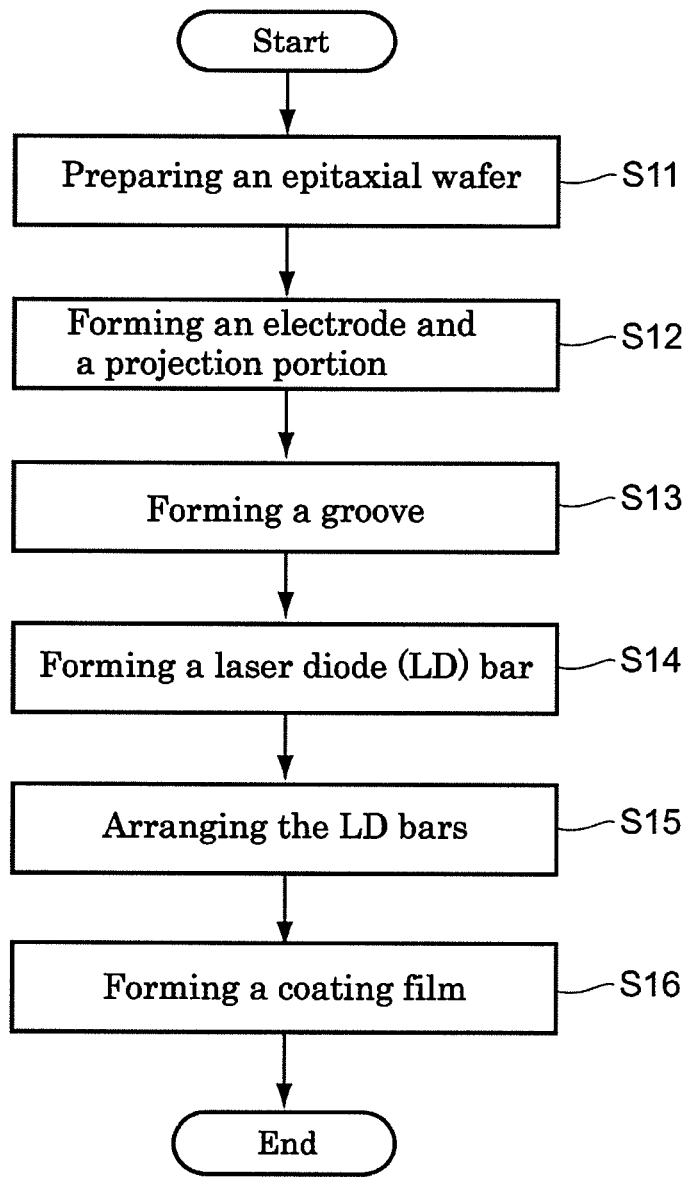
FIG. 1 is a flowchart showing a coating-film forming method according to an embodiment.

A method for forming a coating film on a facet of a semiconductor optical device according to an embodiment of the present invention will now be described in detail with reference to the attached drawings. In the drawings, the same components are given the same reference numerals, and redundant descriptions thereof will be omitted.

FIG. 1 is a flowchart showing the method for forming a coating film on a facet of a semiconductor optical device according to this embodiment. In this embodiment, the method for forming a coating film on a facet of a semiconductor laser as a semiconductor optical device is described. FIGS. 2 to 15 are diagrams for explaining the steps included in the method for forming the coating film on the facet of the semiconductor laser according to this embodiment. In FIGS. 3 to 12B, an XYZ orthogonal coordinate system is illustrated to provide an easier understanding of the description.

[Preparation of Epitaxial Wafer]

Figure 2:
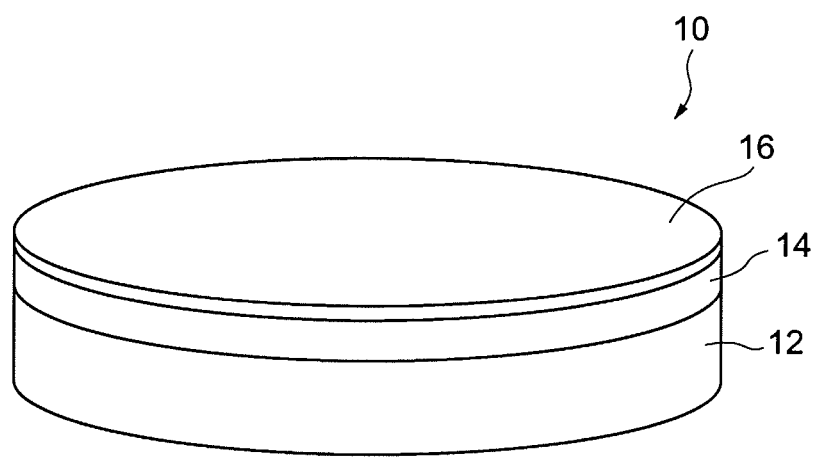
FIG. 2 illustrates an epitaxial wafer.

First, in step S11, an epitaxial wafer 10 shown in FIG. 2 is prepared. The epitaxial wafer 10 includes a substrate 12, a multilayer semiconductor structure 14 grown on a main surface of the substrate 12, and an insulating film 16 formed on the multilayer semiconductor structure 14. The epitaxial wafer 10 has a shape of a plate. The substrate 12 is a substantially disk-shaped component composed of a semiconductor of a first conductivity type (such as n type). The substrate 12 is composed of, for example, a group III-V compound semiconductor, such as InP. The multilayer semiconductor structure 14 is formed of a plurality of semiconductor layers. As an example, the multilayer semiconductor structure 14 has a lower cladding layer composed of InP of a first conductivity type, an active layer composed of GaInAsP, an upper cladding layer composed of InP of a second conductivity type (such as p type), and a contact layer composed of InGaAs of the second conductivity type. These semiconductor layers including the lower cladding layer, the active layer, the upper cladding layer, and the contact layer are epitaxially grown on the main surface of the substrate 12 in this order. The active layer may have a multi quantum well (MQW) structure in which well layers and barrier layers are alternately stacked one on top of the other. Alternatively, the active layer may have a single quantum well (SQW) structure in which a single well layer is sandwiched between barrier layers, or may be formed of a single semiconductor layer. The insulating film 16 is formed of a dielectric film, such as $SiO_2$ or SiN.

[Formation of Electrode]

Figure 3:
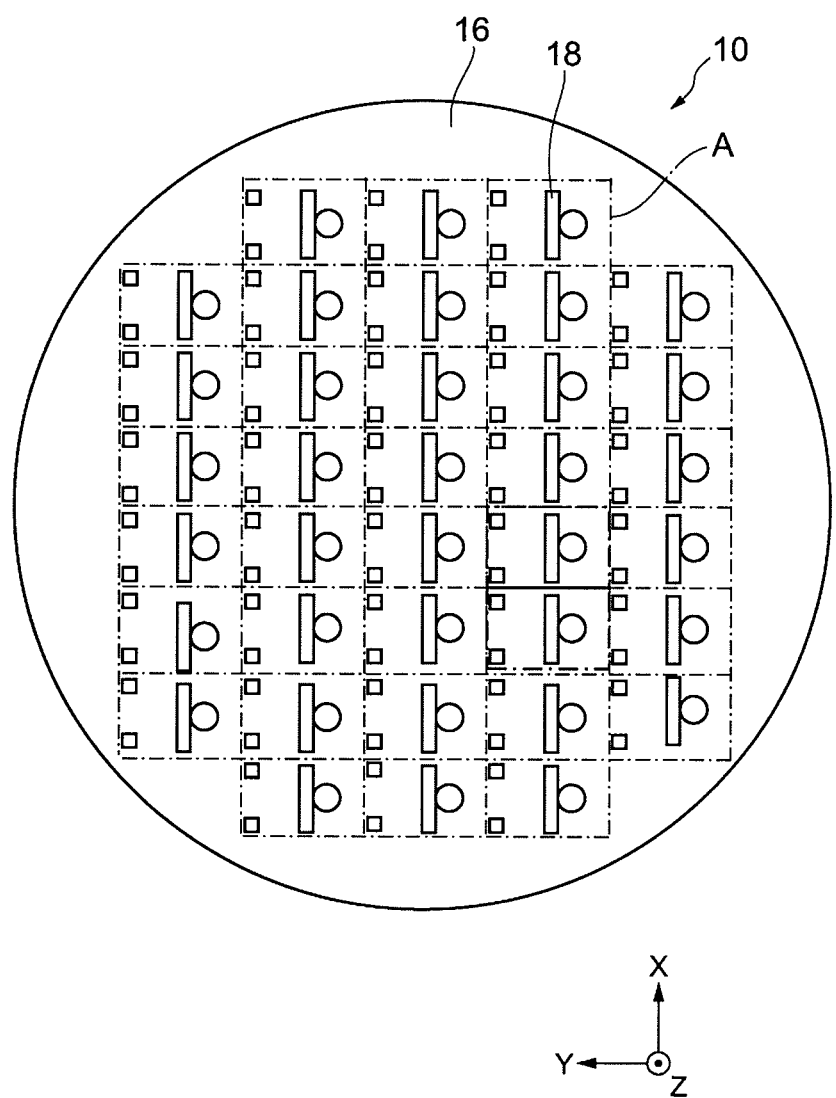
FIG. 3 is a plan view of the epitaxial wafer in a step of forming an electrode, as viewed from a top surface side having an insulating-film (hereinafter, named as insulating-film side).
Figure 4A:
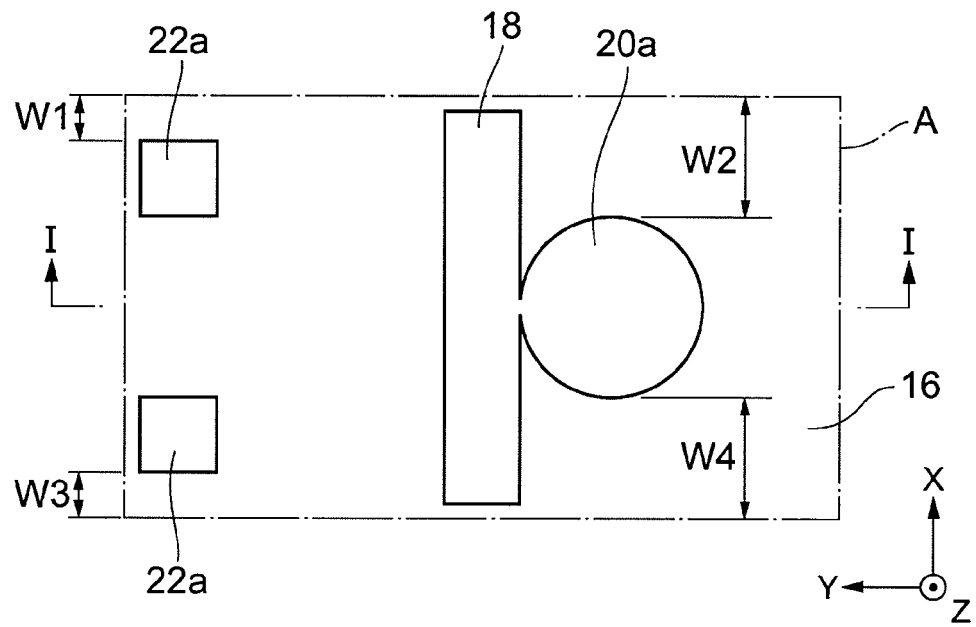
FIGS. 4A and 4B illustrate the step of forming the electrode, FIG. 4A being a diagram showing one of semiconductor laser regions, as viewed from the insulating-film side, FIG. 4B being a cross-sectional view taken along line I-I in FIG. 4A.
Figure 4B:
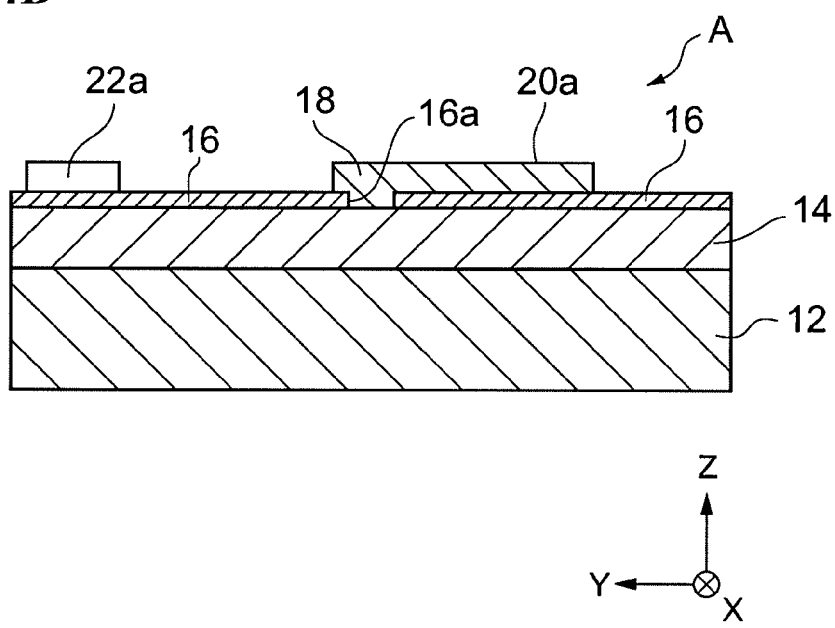
Figure 5A:
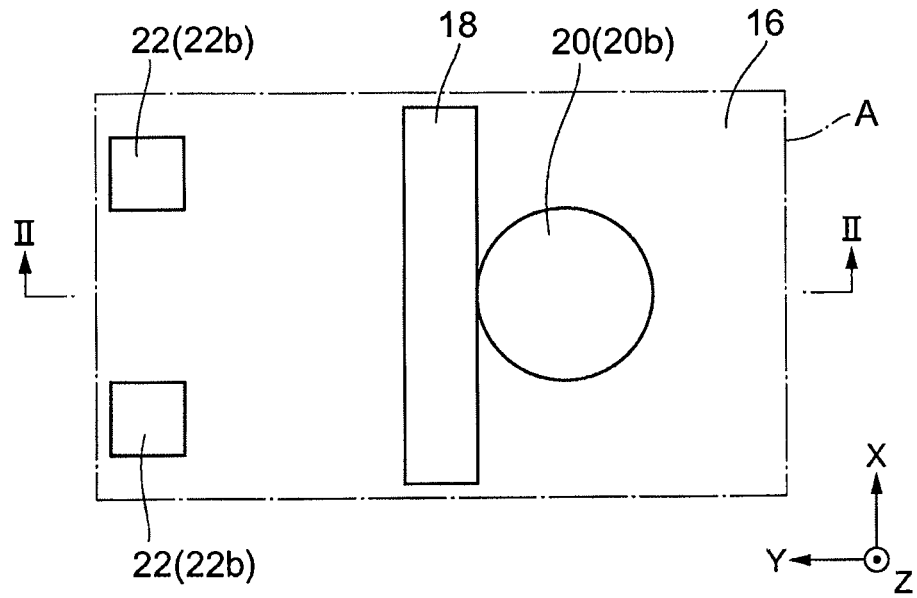
FIGS. 5A and 5B illustrate the step of forming the electrode, FIG. 5A being a diagram showing one of the semiconductor laser regions, as viewed from the insulating-film side, FIG. 5B being a cross-sectional view taken along line II-II in FIG. 5A.
Figure 5B:
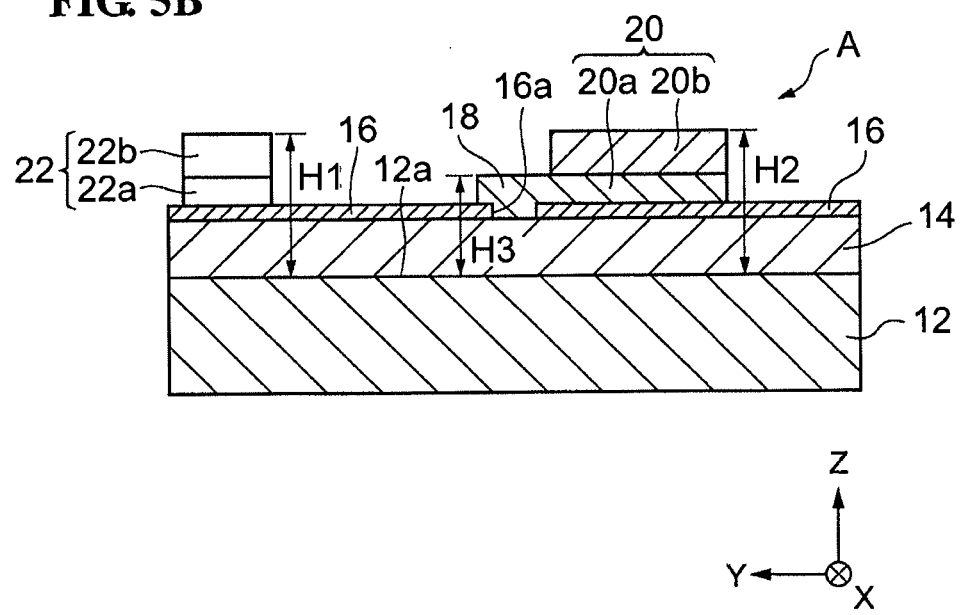
Figure 6:
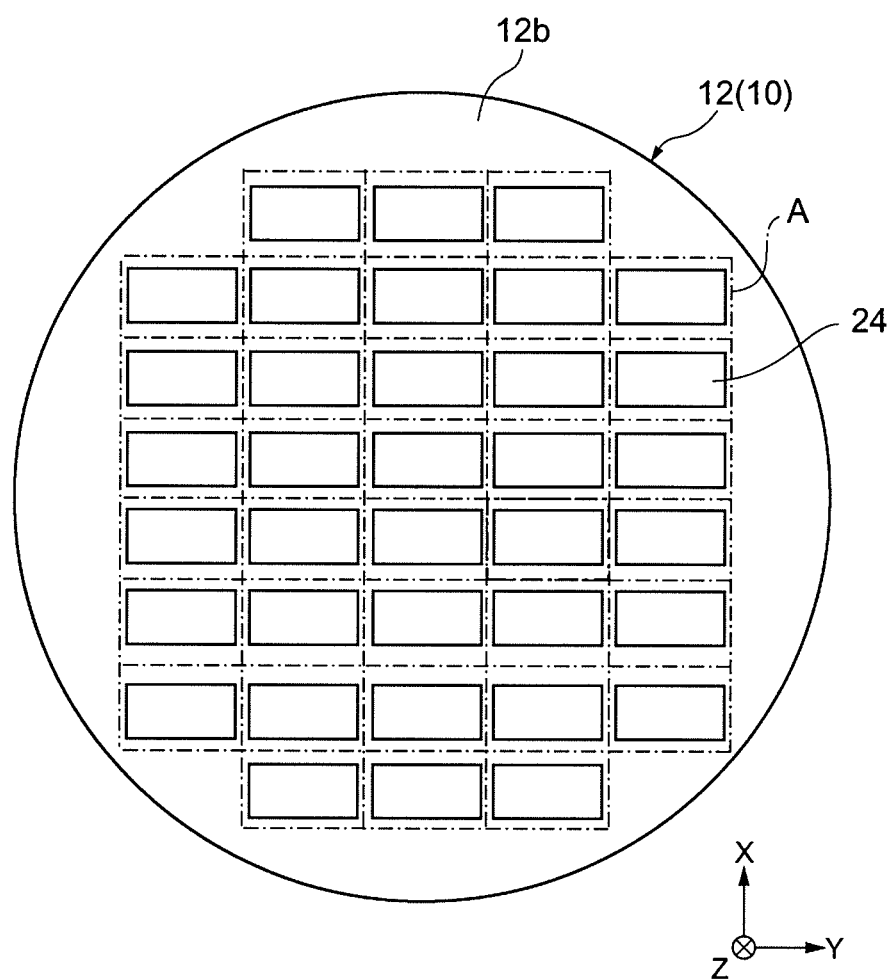
FIG. 6 is a diagram showing the epitaxial wafer in the step of forming the electrode, as viewed from the back side of the wafer.
Figure 7A:
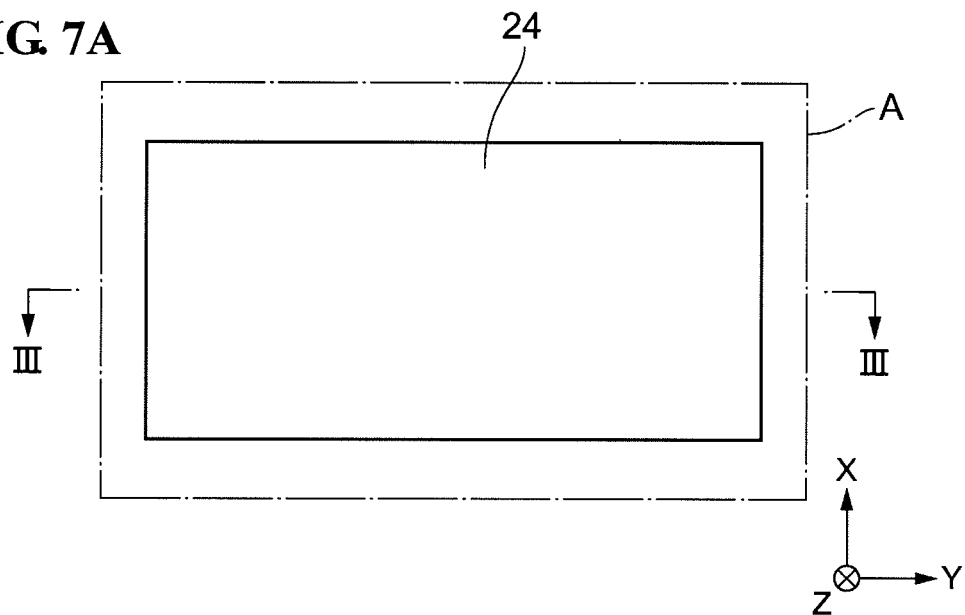
FIGS. 7A and 7B illustrate the step of forming the electrode, FIG. 7A being a diagram showing one of the semiconductor laser regions, as viewed from the back side of the wafer, FIG. 7B being a cross-sectional view taken along line III-III in FIG. 7A.
Figure 7B:
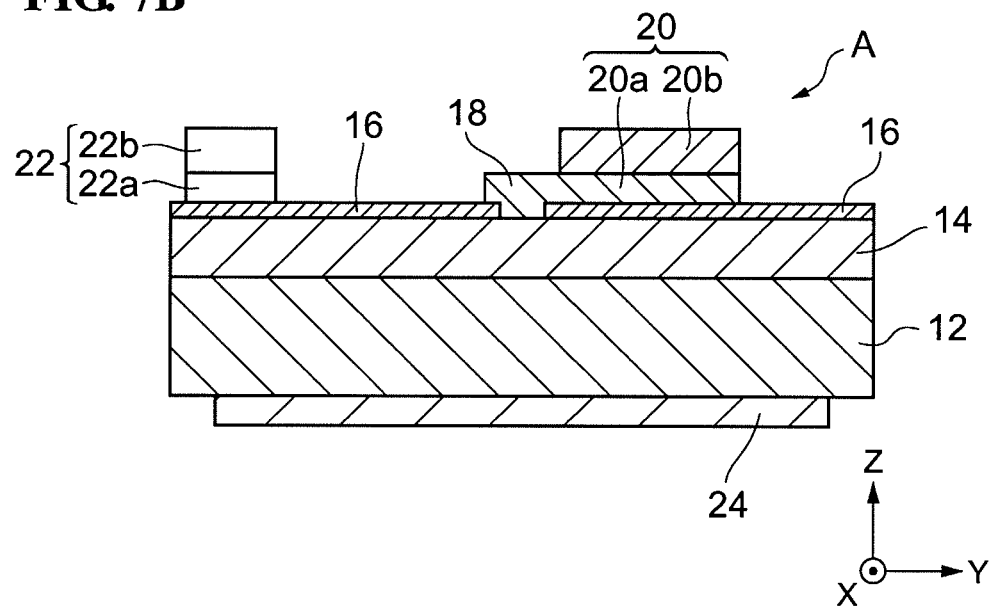

Next, in step S12, an electrode is formed. The process for forming the electrode will be described with reference to FIGS. 3 to 7B. FIG. 3 is a plan view of the epitaxial wafer 10, as viewed from the insulating film 16 side. FIGS. 4A and 5A are diagrams showing one of semiconductor laser regions A, as viewed from the insulating film 16 side. The semiconductor laser region A is a region corresponding to a single semiconductor laser chip. FIG. 4B is a cross-sectional view taken along line I-I in FIG. 4A. FIG. 5B is a cross-sectional view taken along line II-II in FIG. 5A. FIG. 6 is a diagram showing the epitaxial wafer 10, as viewed from the back side of the substrate 12. FIG. 7A is a diagram showing one of the semiconductor laser regions A, as viewed from the back side of the substrate 12. FIG. 7B is a cross-sectional view taken along line III-III in FIG. 7A.

In the step S12, openings 16a (see FIG. 4B) are first formed in the insulating film 16 by removing areas where stripe electrodes are to be formed, so that the multilayer semiconductor structure 14 is exposed through the aforementioned areas. Next, stripe electrodes 18 are formed on the exposed areas of the multilayer semiconductor structure 14. The stripe electrodes 18 directly contact with the top surface of the contact layer of the multilayer semiconductor structure 14 so as to form an ohmic contact. In this step, a stripe electrode 18 is formed in each of the semiconductor laser regions A. Here, a single semiconductor laser chip (device) is obtained from a single semiconductor laser region A. The stripe electrodes 18 extend longitudinally in a first direction (i.e., X direction) and are arranged in a second direction (i.e., Y direction) perpendicular to the first direction.

Furthermore, in the step S12, base patterns 20a constituting bonding pads and base patterns 22a are formed simultaneously with the stripe electrodes 18 on the surface of the insulating film 16. In this embodiment, a single base pattern 20a is formed in each of the semiconductor laser regions A. As an example, each base pattern 20a is formed in an area adjacent to the corresponding stripe electrode 18 and has, for example, a circular shape in plan view. Preferably, each base pattern 20a is formed in an area adjacent to a central portion of the corresponding stripe electrode 18 in the longitudinal direction (i.e., X direction).

As shown in FIG. 3, in this embodiment, two base patterns 22a are formed in each of the semiconductor laser regions A. In this step, at least a single base pattern 22a may be formed on each of a plurality of sections, which are to become LD bars in a subsequent step, of the multilayer semiconductor structure 14. In other words, the base pattern 22a may be formed on the multilayer semiconductor structure 14 so that a single LD bar has at least one base pattern 22a on the surface of the LD bar (see FIGS. 11A and 12A).

As an example of this step, each semiconductor laser region A has two base patterns 22a formed at positions opposite to the base pattern 20a with the stripe electrode 18 interposed therebetween. Preferably, the two base patterns 22a may be formed in areas that are sufficiently distant from the stripe electrode 18. More preferably, a distance W1 between one edge of the semiconductor laser region A in the first direction (i.e., X direction) and one of the base patterns 22a may be shorter than a distance W2 between the same edge of the semiconductor laser region A and the base pattern 20a. Likewise, a distance W3 between the other edge of the semiconductor laser region A in the first direction (i.e., X direction) and the other base pattern 22a may be shorter than a distance W4 between the same edge of the semiconductor laser region A and the base pattern 20a.

Since the base patterns 20a and 22a are formed simultaneously with the stripe electrodes 18, the base patterns 20a and 22a have the same structure as the stripe electrodes 18. The stripe electrodes 18 and the base patterns 20a and 22a are preferably formed by depositing metal films composed of, for example, Ti/Pt/Au, and then gold-plating the metal films. As an example, the thicknesses of Ti, Pt and Au are 50 nm, 100 nm, and 500 nm, respectively. So, the total thickness of the metal films composed of Ti/Pt/Au is 650 nm.

Subsequently, as shown in FIGS. 5A and 5B, the base patterns 20a and 22a are selectively gold-plated so as to form additional plating layers 20b and 22b. Thus, a bonding pad 20 and film-like projection portions 22 are formed in each semiconductor laser region A on the multilayer semiconductor structure 14. Therefore, the projection portion 22 and the bonding pad 20 have the same structure, and the projection portion 22 and the bonding pad 20 are composed of the same material as a metallic material. Specifically, each bonding pad 20 is constituted by the base pattern 20a and the additional plating layer 20b, and is electrically connected to the corresponding stripe electrode 18. Each projection portion 22 is constituted by the base pattern 22a and the additional plating layer 22b. With this additional plating process, heights H1 and H2 of the bonding pads 20 and the projection portions 22 measured from a main surface 12a of the substrate 12 become greater than a height H3 of the stripe electrodes 18. As an example, the thickness of the additional plating layers 20b and 22b is 4 µm. The height H1 of the projection portions 22 is preferably equal to or smaller than the height H2 of the bonding pads 20.

Subsequently, the thickness of the substrate 12 is reduced by polishing the back surface of the substrate 12. As an example, the thickness of the substrate 12 is 100 µm after polishing. Then, as shown in FIGS. 6, 7A, and 7B, electrodes 24 are formed on a back surface 12b of the substrate 12. In this step, a single electrode 24 is formed in each of the semiconductor laser regions A. As an example, the electrodes 24 are formed by depositing a metal film on the back surface 12b of the substrate 12 and then removing areas along the boundaries of the semiconductor laser regions A from this metal film.

[Formation of Groove]

Figure 8:
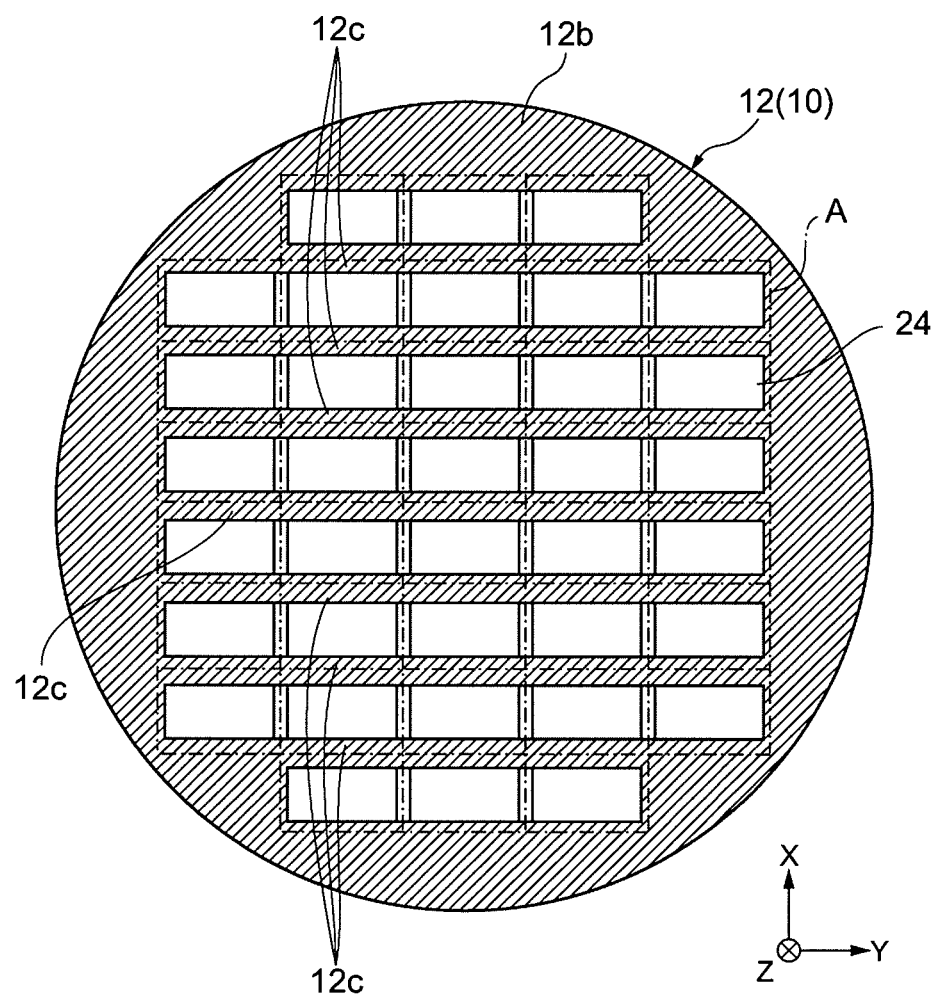
FIG. 8 is a diagram showing the wafer in a step of forming a groove, as viewed from the back side thereof.
Figure 9A:
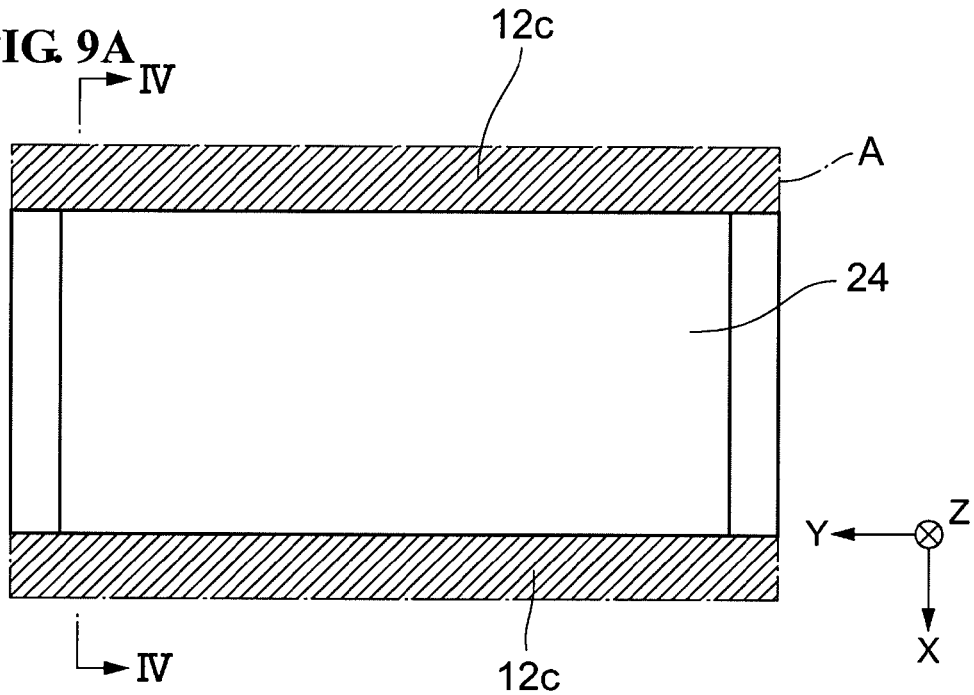
FIGS. 9A and 9B illustrate the step of forming the groove, FIG. 9A being a diagram showing one of the semiconductor laser regions, as viewed from the back side of the wafer, FIG. 9B being a cross-sectional view taken along line IV-IV in FIG. 9A.
Figure 9B:
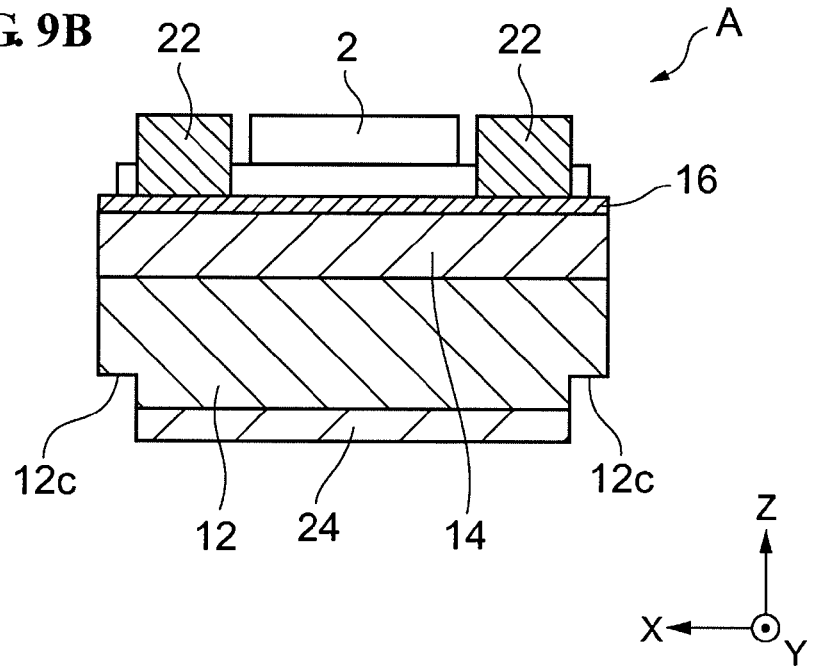

Next, in step S13, grooves are formed in the back surface 12b of the substrate 12. FIG. 8 is a diagram showing the substrate 12, as viewed from the back side thereof. FIG. 9A is a diagram showing one of the semiconductor laser regions A, as viewed from the back side of the substrate 12. In FIGS. 8 and 9A, grooves 12c formed in this step are represented by hatched areas. FIG. 9B is a cross-sectional view taken along line IV-IV in FIG. 9A.

In this step S13, the grooves 12c are formed by performing etching on predetermined areas, represented by hatched areas in FIGS. 8 and 9A, of the back surface 12b of the substrate 12. The grooves 12c formed in this step mainly extend in the second direction (i.e., Y direction) along the boundary lines between the semiconductor laser regions A adjacent to each other in the first direction (i.e., X direction). If the thickness of the substrate 12 is 100 µm, the depth of the grooves 12c is, for example, about 10 µm. It is preferable that the depth of the grooves 12c be 30 µm or smaller. By limiting the depth of the grooves 12c in this manner, the mechanical strength of the epitaxial wafer 10 prior to being segmented into a plurality of LD bars in a subsequent step can be appropriately maintained.

When the grooves 12c are formed in this step, the electrodes 24 is used as masks. In that case, it is preferable to form the grooves 12c by wet etching so as to reduce damages to the electrodes 24. The grooves 12c may be formed by wet etching with a resist as a mask. Furthermore, the grooves 12c may be formed by dry etching with a resist as a mask.

[Formation of LD Bar]

Figure 10:
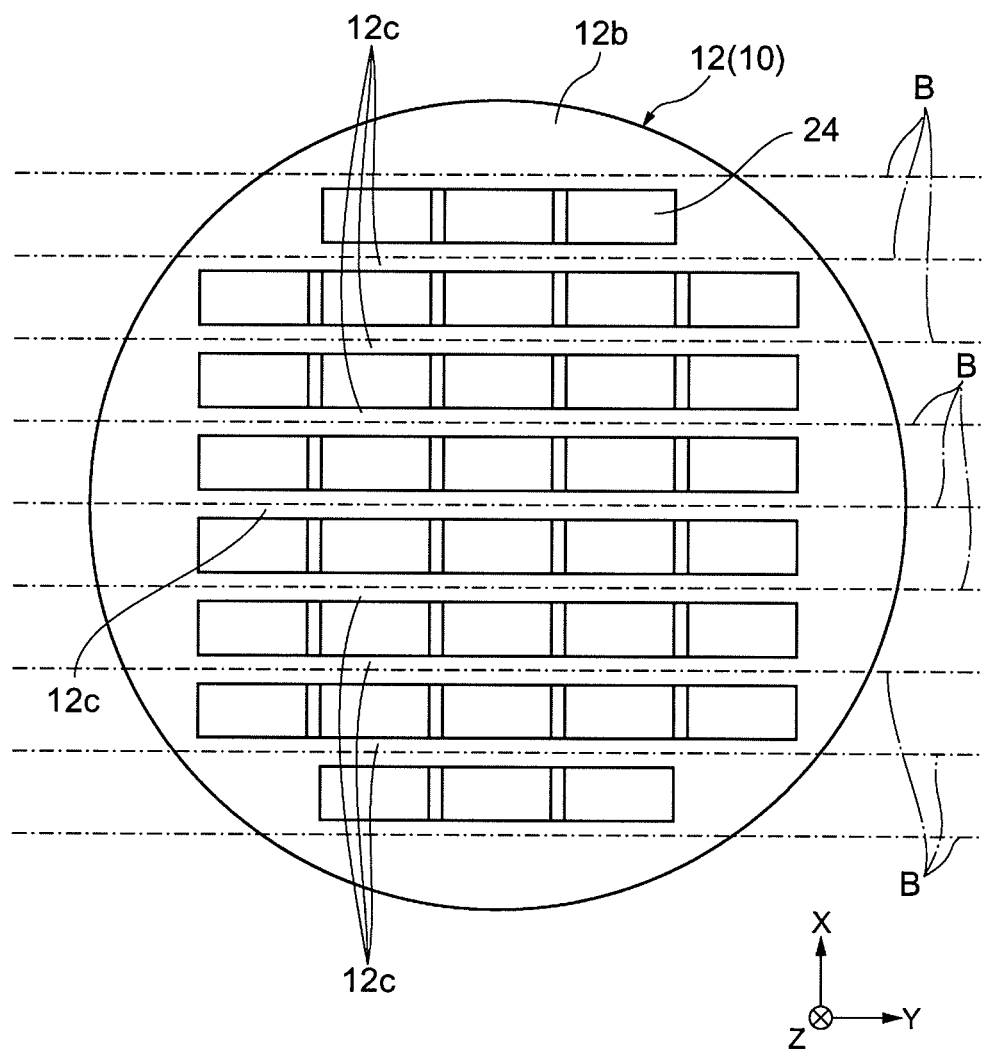
FIG. 10 is a diagram showing the wafer in a step of forming an LD bar, as viewed from the back side thereof.
Figure 12A:
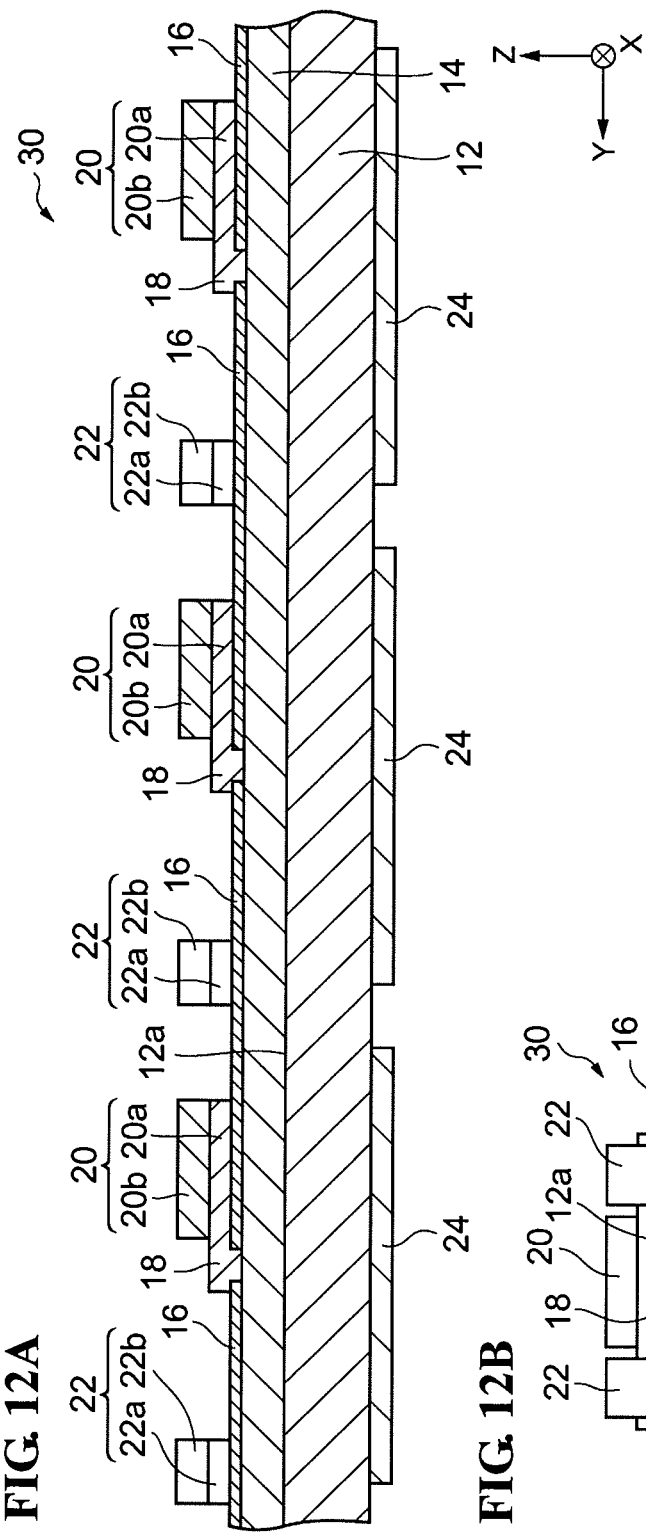
FIG. 12A is a cross-sectional view taken along line V-V in FIG. 11A.
Figure 12B:
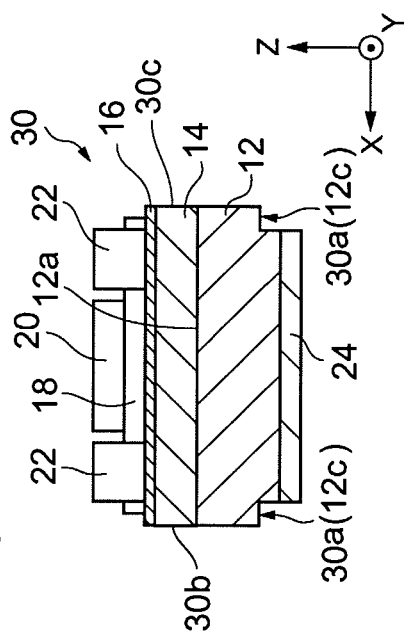
FIG. 12B is a cross-sectional view taken along line VI-VI in FIG. 11A.

Subsequently, in step S14, the epitaxial wafer 10 is cut in the second direction (i.e., Y direction) by, for example, cleaving the epitaxial wafer 10 so as to form a plurality of LD bars. FIG. 10 is a diagram showing the substrate 12, as viewed from the back side thereof, and illustrates a plurality of scribe lines B extending in the second direction (i.e., Y direction). The scribe lines B are aligned with the boundary lines between the semiconductor laser regions A adjacent to each other in the first direction (i.e., X direction). FIG. 11A is a diagram showing one of LD bars 30 formed in this step, as viewed from the top surface side having insulating film 16. FIG. 11B is a diagram showing the LD bar 30, as viewed from the back surface 12b side. FIG. 12A is a cross-sectional view taken along line V-V in FIG. 11A. FIG. 12B is a cross-sectional view taken along line VI-VI in FIG. 11A. In this step for forming LD bars, the epitaxial wafer 10 may be segmented by being cut or cleaved along the center lines of the grooves 12c formed in the substrate 12 in the previous step. Consequently, as shown in FIG. 12B, recessed portions 30a are formed along opposite edges, in the first direction (i.e., X direction), of the back surface of the LD bar 30.

In the step S12 for forming the electrode described above, the distance W1 (see FIG. 4A) is set to be shorter than the distance W2, and the distance W3 is set to be shorter than the distance W4. Therefore, distance W5 between side surface 30b of LD bar 30 and the projection portion 22 would be shorter than distance W6 between the side surface 30b and the bonding pad 20. Similarly, distance W7 between side surface 30c of LD bar 30 and the projection portion 22 would be shorter than distance W8 between the side surface 30c and the bonding pad 20. Here, side surfaces 30b and 30c of LD bar 30 are to be end facets of LD device.

[Arrangement of LD Bar]

Figure 13:
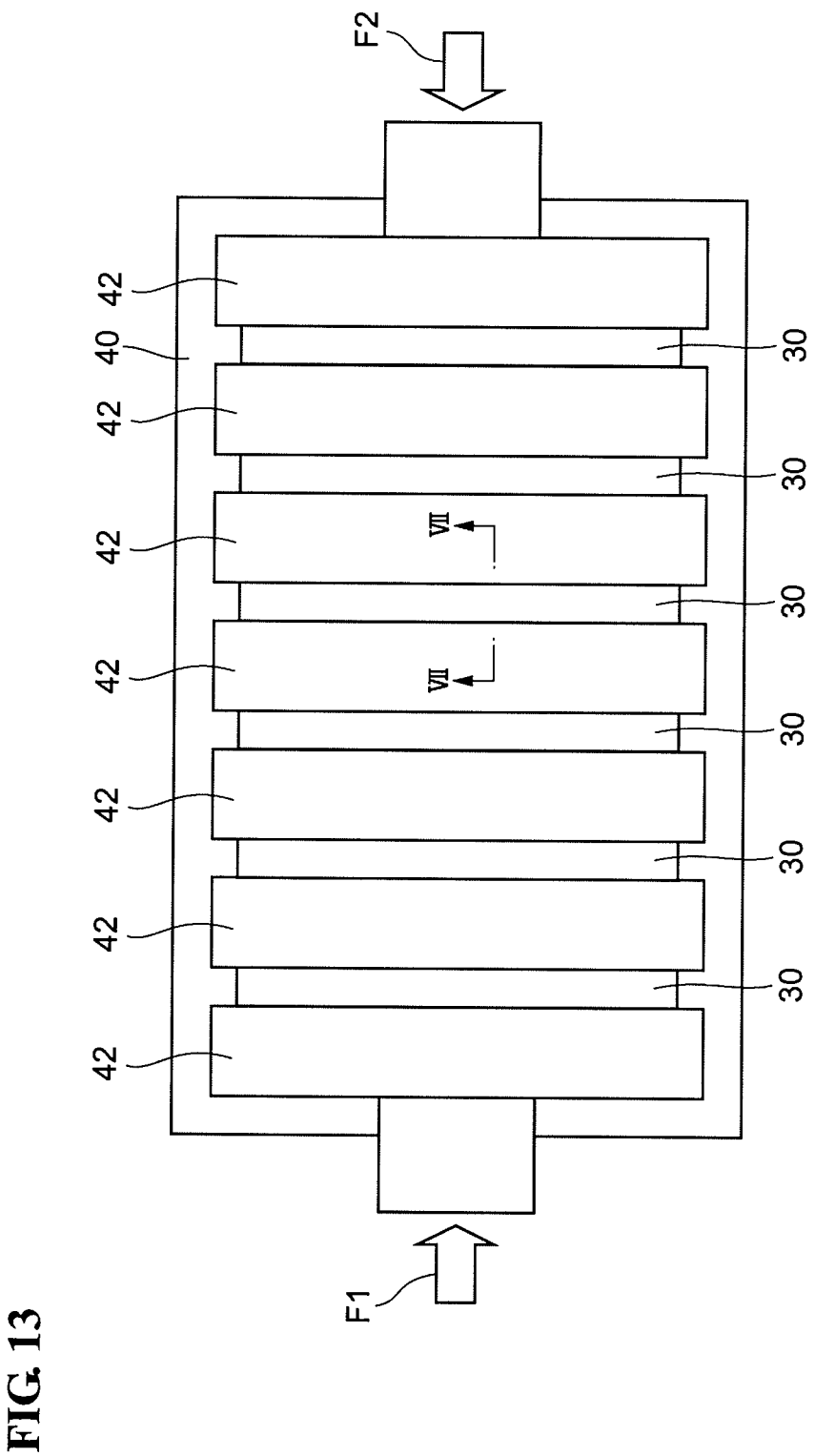
FIG. 13 is a plan view showing a method to arrange the LD bars.
Figure 14:
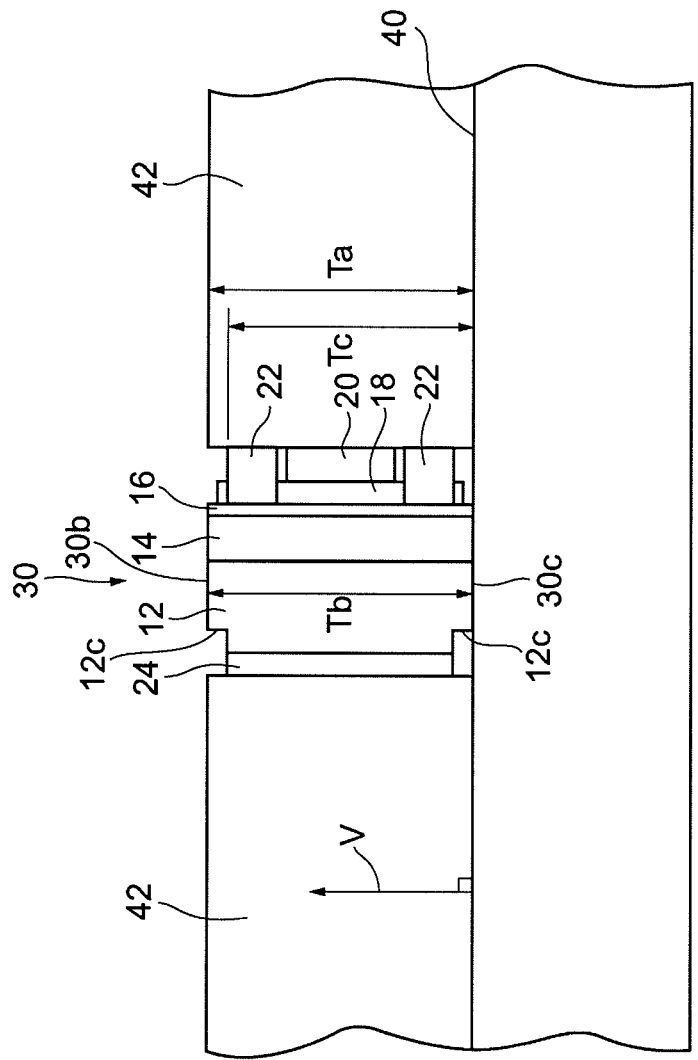
FIG. 14 is a schematic cross-sectional view taken along line VII-VII in FIG. 13.

Subsequently, in step S15, the LD bars 30 are arranged on a flat surface so as to prepare for forming coating films on the side surfaces 30b and 30c of each LD bar 30. FIG. 13 is a plan view showing the method to arrange the LD bars 30. FIG. 14 is a schematic cross-sectional view taken along line VII-VII in FIG. 13. As shown in FIGS. 13 and 14, in this step, the LD bars 30 are placed on a flat support surface 40 of apparatus for facet coating. One of the side surfaces 30b and 30c (i.e., the side surface 30b in FIGS. 13 and 14) of each LD bar 30 is oriented in the normal direction (i.e., a direction denoted by an arrow V in FIG. 14) of the support surface 40. In other words, the LD bars 30 are placed on the support surface 40 such that the LD bars 30 lie sideways with the insulating films 16 thereof or the back surfaces 12b thereof oriented in the same direction. Then, the LD bars 30 are arranged in a direction perpendicular to the longitudinal direction of the LD bars 30.

Furthermore, in this step, spacers 42 are disposed between the neighboring LD bars 30. As shown in FIG. 13, the spacers 42 are, for example, long plate-like components composed of silicon and extend in the longitudinal direction of the LD bars 30. Moreover, as shown in FIG. 14, the spacers 42 in this embodiment each have a thickness Ta that is substantially equal to a width Tb of each LD bar 30 in the cavity length direction (i.e., a direction in which the side surfaces 30b and 30c of the LD bar 30 face each other). A preferred thickness Ta of each spacer 42 is larger than or equal to a height Tc from the support surface 40 to the upper end of each projection portion 22. And the thickness Ta of each spacer 42 is preferably smaller than or equal to the width Tb of each LD bar 30 in the cavity length direction. By giving the spacers 42 such a thickness, the mechanical strength of the spacers 42 can be ensured even when the width Tb is small.

[Formation of Coating-Film]

Figure 15:
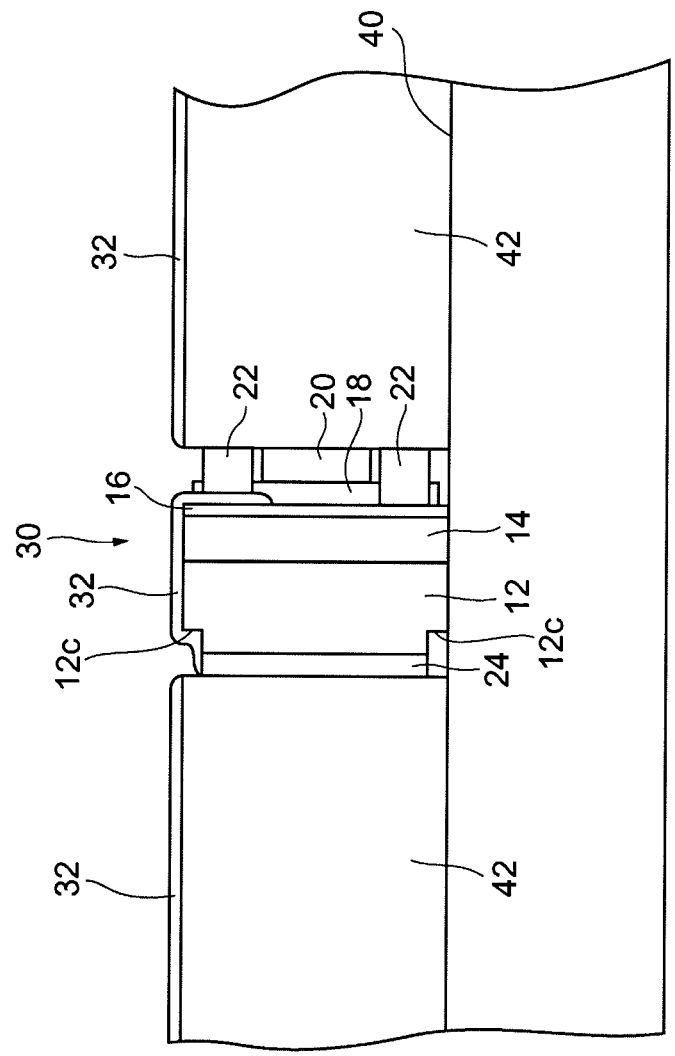
FIG. 15 illustrates a step of forming a coating-film on end facets of the LD bars.

Subsequently, as indicated by arrows F1 and F2 in FIG. 13, the LD bars 30 are secured by applying inward forces thereto, by clamping, spring pressure (clamper or spring not shown) or the like, from opposite sides in the arranged direction thereof. This is to prevent the LD bars 30 from falling off from the support surface 40 when a coating film is being formed. While maintaining this state, a coating film 32 is formed entirely over the side surfaces 30b (or the side surfaces 30c) of the LD bars 30 in step S16, as shown in FIG. 15.

After the steps described above, the LD bars 30 are each cut into chips in accordance with the semiconductor laser regions A shown in FIG. 3, whereby semiconductor laser chips (devices) are obtained.

The coating-film forming method for a semiconductor laser according to this embodiment achieves the following advantages. Specifically, in this coating-film forming method, a plurality of projection portions 22 are formed on the multilayer semiconductor structure 14 of the epitaxial wafer 10 prior to the step S14 for forming LD bar. Furthermore, each of the LD bars 30 has at least one projection portion 22. In the subsequent step S15, the LD bars 30 are arranged such that the side surfaces 30b thereof are oriented in the normal direction V of the support surface 40, as shown in FIG. 14. Therefore, the projection portion 22 on each LD bar 30 is interposed between the multilayer semiconductor structure 14 and the corresponding spacer 42. Because the height H1 (see FIG. 5A) of the projection portions 22 measured from the main surface 12a is greater than the height H3 of the stripe electrodes 18, the spacer 42 can be prevented from coming into contact with the stripe electrodes 18, thereby reducing damages to the stripe electrodes 18 caused by the spacer 42.

Furthermore, as shown in FIG. 5B, the height H1 of the projection portions 22 is greater than the height H3 of the stripe electrodes 18. Therefore, gaps (see FIG. 14) are formed between the spacers 42 and the stripe electrodes 18 in the step S15. As a result, a coating film is also formed on the stripe electrodes 18. Therefore, by checking the condition of the coating formed on the stripe electrodes 18, it can be accurately determined whether or not the coating films 32 are properly formed. However, in this case, a coating film is not formed on the surface of the bonding pads 20 because the surface of the bonding pad 20 contacts with the spacer 42 without gaps. Therefore, wire is well bonded on the surface of the bonding pad 20.

Furthermore, as in this embodiment, a plurality of projection portions 22 are preferably formed simultaneously with the formation of the multiple bonding pads 20 in the step S12 for forming the electrode. Consequently, the projection portions 22 can be readily formed without additional forming processes.

Figure 16A:
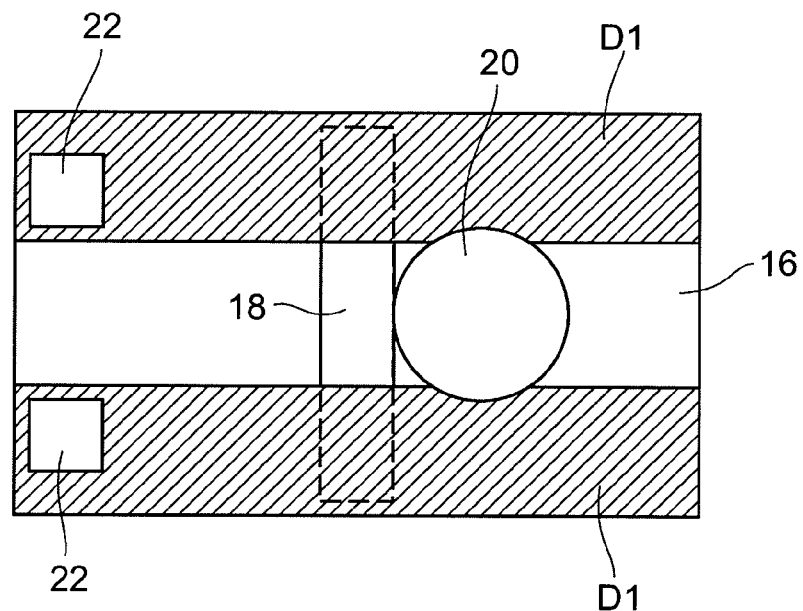
FIG. 16A is a plan view of one of semiconductor lasers provided with coating films.

Furthermore, as described above, the height H1 of the projection portions 22 measured from the main surface 12a of the substrate 12 is preferably smaller than or equal to the height H2 of the bonding pads 20 measured from the main surface 12a. When the LD bars 30 are arranged on the support surface 40, the bonding pads 20 and the spacers 42 can be brought into contact with each other, as shown in FIG. 14. Therefore, gaps between the bonding pads 20 on the LD bars 30 and the spacers 42 are not formed. As a result, the gas used for forming the coating films 32 does not flow on the surface of the bonding pad 20. Then, the surface of the bonding pad 20 is not covered with the coating film. Therefore, a favorable electrical contact between wires and the bonding pads 20 can be achieved when the wires are bonded on the bonding pads 20. FIG. 16A is a plan view of one of semiconductor lasers provided with the coating films 32. In FIG. 16A, hatched areas D1 show an example of areas where the gas used for forming coating films 32 has flowed in at the top side of the semiconductor laser. As shown in FIG. 16A, the coating material does not reach the upper surface of the bonding pad 20. Therefore, a favorable electrical contact can be achieved between the bonding pad 20 and the wire.

Furthermore, as shown in FIG. 11A, the distances W5 and W7 between the side surfaces 30b and 30c of each LD bar 30 and the projection portions 22 are preferably shorter than the distances W6 and W8 between the side surfaces 30b and 30c of the LD bar 30 and the bonding pads 20. Thus, when the LD bars 30 are arranged on the support surface 40, the upper ends of the projection portions 22 are positioned higher than the bonding pads 20 (see FIG. 14). With the projection portions 22, the edges of the spacers 42 and the stripe electrodes 18 can be effectively prevented from coming into contact with each other.

Furthermore, as in this embodiment, after forming the grooves 12c in the back surface 12b of the substrate 12, the epitaxial wafer 10 is preferably segmented by being cut along the grooves 12c in the step S14 for forming LD bar. Thus, as shown in FIG. 12B, the recessed portions 30a are formed in the back surface of each LD bar 30. When the coating films 32 are formed on the side surfaces 30b and 30c of the LD bar 30, the coating films 32 are appropriately separated along the recessed portions 30a, as shown in FIG. 15. In the conventional method for forming the coating film on an end facet of a semiconductor laser, spacers thinner than the LD bar are used. In this conventional method, the coating films are separated by forming uneven surfaces between the back surface of each LD bar and the spacers. In contrast, with the method according to this embodiment, the coating films 32 can be separated regardless of the thickness of the spacers 42, thereby allowing for the use of thicker spacers 42. Consequently, the mechanical strength of the spacers 42 is increased so that deformation thereof is reduced, and damages to the stripe electrodes 18 caused by the spacers 42 can be reduced.

Figure 16B:
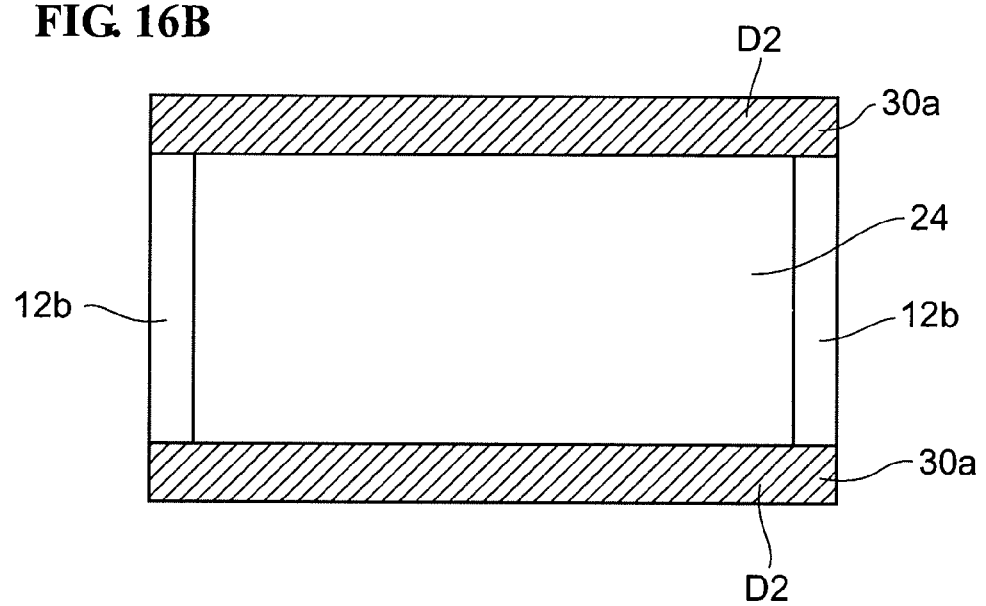
FIG. 16B is a bottom view of the semiconductor laser provided with the coating films.

FIG. 16B is a bottom view of one of the semiconductor lasers provided with the coating films 32. In FIG. 16B, hatched areas D2 show an example of areas where the gas used for forming coating films 32 has flowed in at the back side of the semiconductor laser. As shown in FIG. 16B, with the coating-film forming method according to this embodiment, the gas for forming coating films mainly flows into the recessed portions 30a and thus the coating material does not reach the upper surface of the electrode 24. Consequently, a reduction in the mounting strength and a reduction in a heat dissipation effect that can be caused by the coating material reaching the electrode 24 can be prevented.

Figure 17:
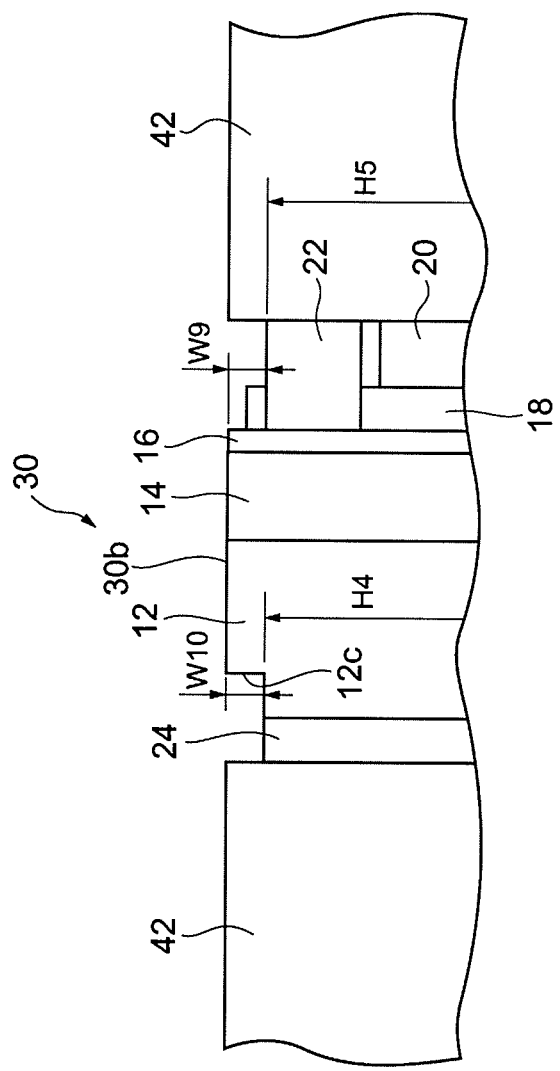
FIG. 17 is an enlarged view showing one of the LD bars and the vicinity thereof in a step of arranging the LD bars.

Furthermore, in this embodiment, it is preferable that half the width of each groove 12c in the first direction (i.e., X direction) shown in FIG. 8 is substantially equal to each of the distances W1 and W3 (see FIG. 4A) between the projection portions 22 and the edges of each semiconductor laser region A in the same direction. Thus, as shown in FIG. 17, a distance W9 between the side surface 30b of each LD bar 30 and the corresponding projection portion 22 becomes substantially equal to a distance W10 between the side surface 30b and a sidewall of the groove 12c (i.e., a sidewall of the corresponding recessed portion 30a). In this case, when the multiple LD bars 30 are arranged on the support surface 40 in the step S15, a height H4 of the recessed portions 30a from the support surface 40 can be set substantially equal to a height H5 of the projection portions 22, thereby achieving a balanced force applied to opposite sides of each LD bar 30 from the spacers 42. As a result, the multiple LD bars 30 can be stably supported in position.

Furthermore, as shown in FIGS. 5A and 5B, the projection portions 22 are preferably formed in the vicinity of the edges of the semiconductor laser region A in the second direction (i.e., Y direction). Thus, when the LD bars 30 are sandwiched between the spacers 42, the LD bars 30 are pressed with a uniform force in the longitudinal direction of the LD bars 30.

Furthermore, in this embodiment, the width of each LD bar 30 in the first direction (i.e., X direction) is preferably smaller than or equal to 200 μm. The width of each LD bar 30 in the first direction (i.e., X direction) is a cavity length of the semiconductor laser. In the conventional method of forming a coating film on an end facet of a semiconductor laser, the spacers need to be reduced in thickness in accordance with the width of the LD bars. Especially, the spacers with a smaller thickness are used in the process of forming the coating films for the LD bars having a relatively small width. This causes the spacers to deform easily. The coating-film forming method according to this embodiment is especially advantageous when the width of each LD bar 30 in the first direction (i.e., X direction) is smaller than or equal to 200 μm. Even in such a case where the coating films are formed on the facets of the LD bars having a small width, the spacers 42 does not contact with the stripe electrodes 18. Therefore, damages to the stripe electrodes 18 caused by the spacers 42 can be reduced.

Generally, when a semiconductor laser chip is mounted on a sub-mount or package, a semiconductor laser chip is transported by using a vacuum chuck tool equipped with a collet. In transporting the semiconductor laser chip, the collet comes into contact with a portion of the surface of the semiconductor laser chip. In this embodiment, the projection portions 22 are preferably formed in areas excluding the area where the collet comes into contact with the surface of the semiconductor laser chip.

[Modification]

Figure 18A:
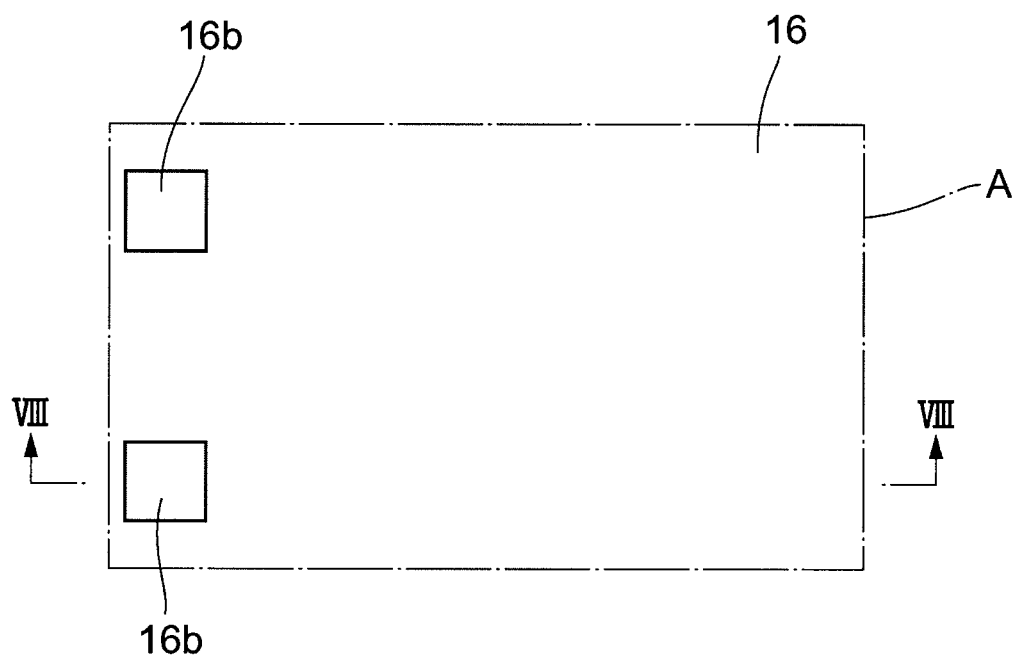
FIG. 18A is a diagram showing one of semiconductor laser regions in a step of forming a projection portion according to a modification, as viewed from the insulating-film side.
Figure 18B:
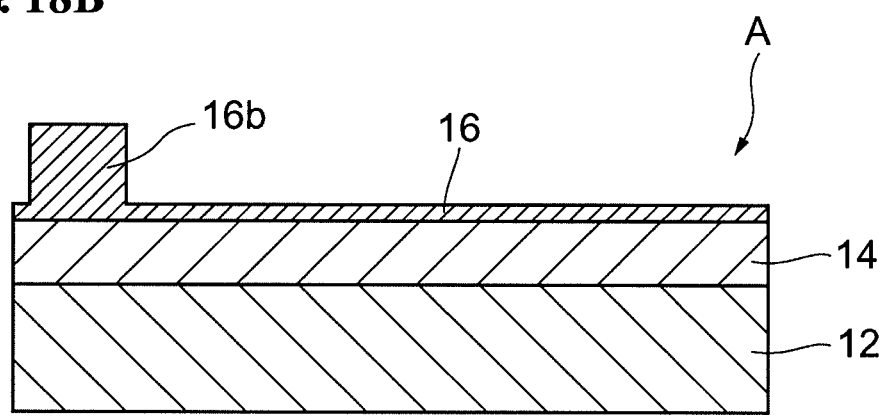
FIG. 18B is a cross-sectional view taken along line VIII-VIII in FIG. 18A.
Figure 19A:
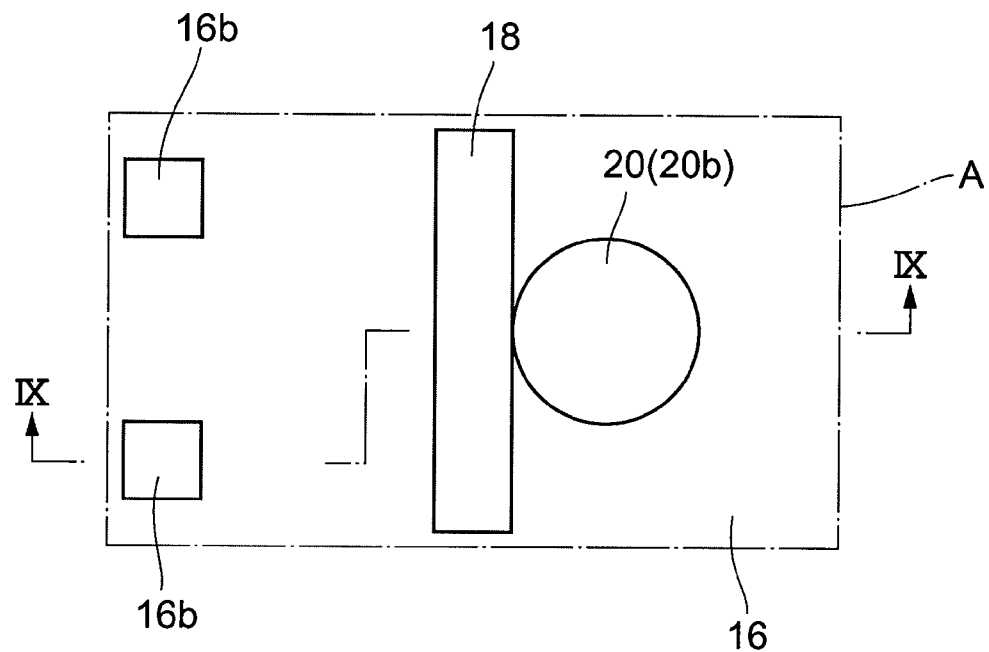
FIG. 19A is a diagram showing one of the semiconductor laser regions in a step of forming an electrode according to the modification, as viewed from the insulating-film side.
Figure 19B:
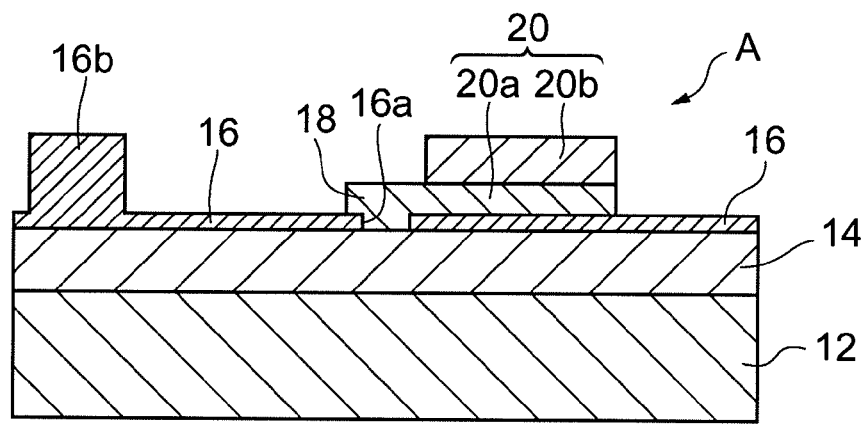
FIG. 19B is a cross-sectional view taken along line IX-IX in FIG. 19A.
Figure 20A:
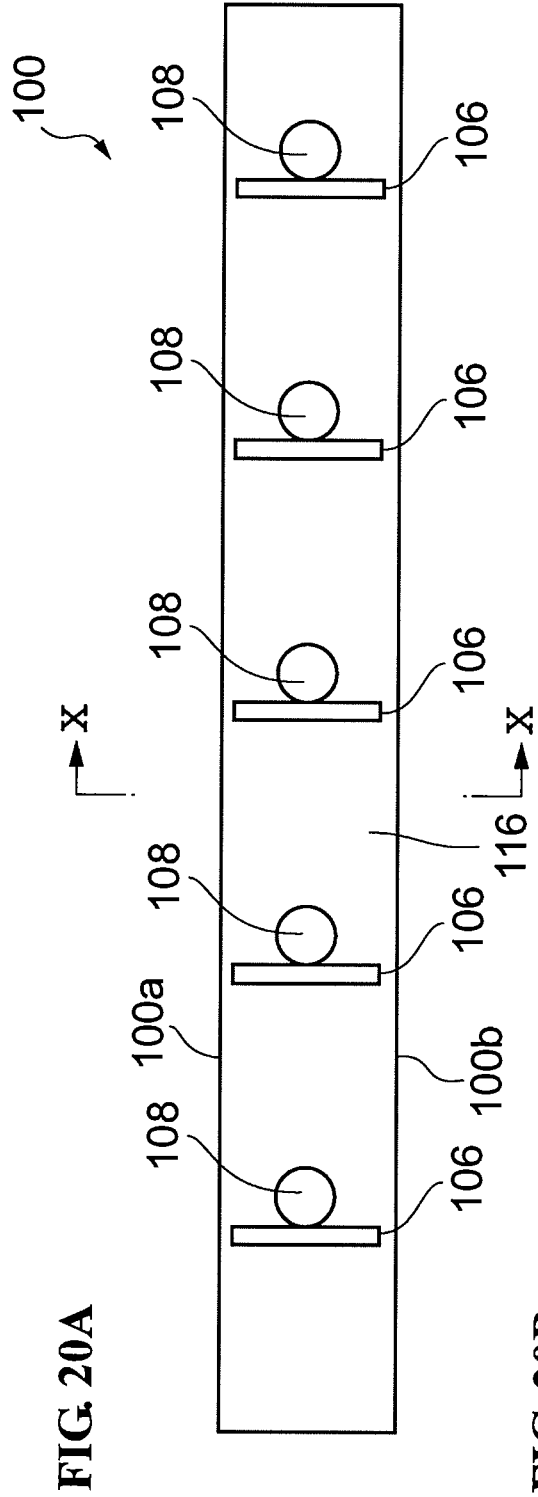
FIG. 20A is a plan view of one of LD bars formed in accordance with a conventional coating-film forming method.
Figure 20B:
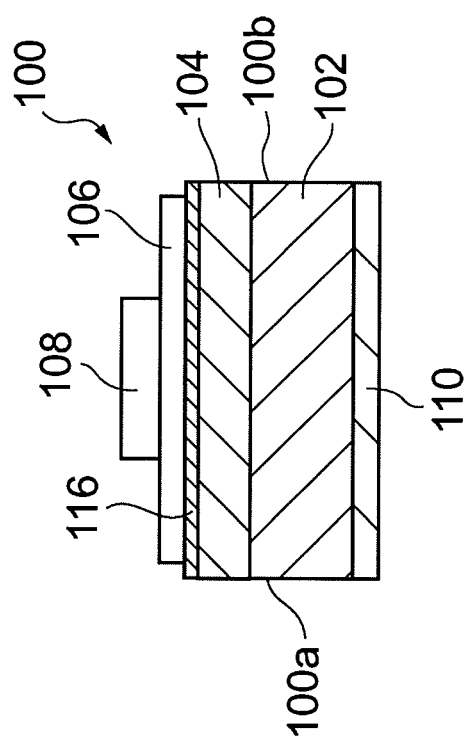
FIG. 20B is a cross-sectional view taken along line X-X in FIG. 20A.
Figure 21:
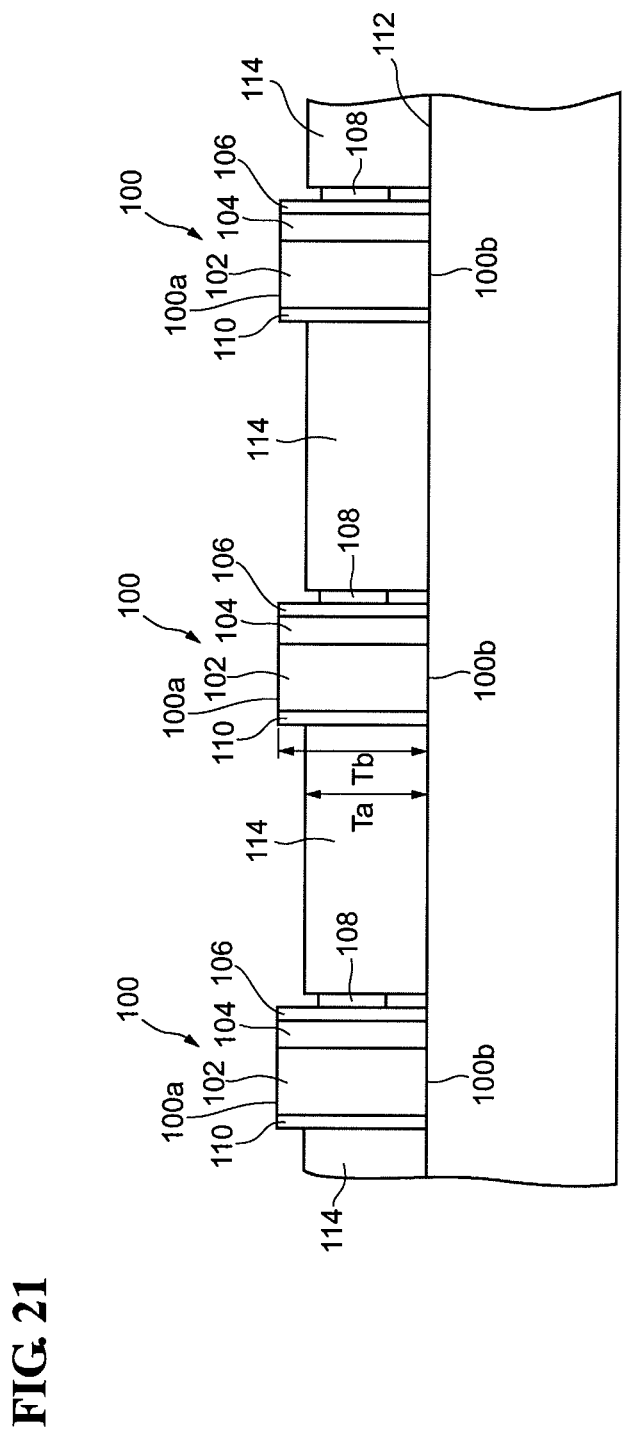
FIG. 21 illustrates an arrangement of the LD bars shown in FIGS. 20A and 20B for forming a coating film thereon.
Figure 22:
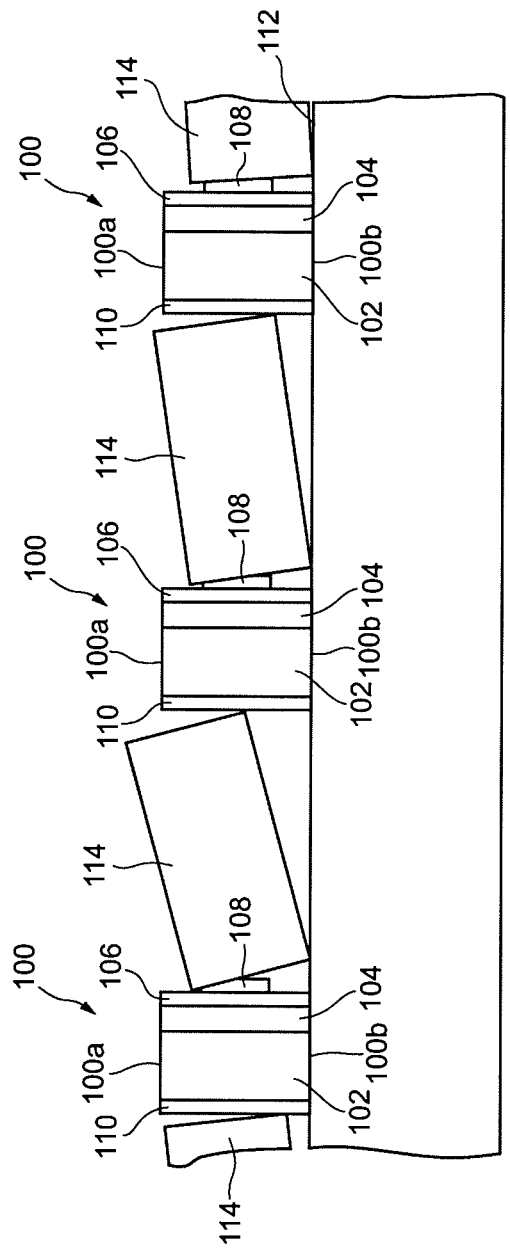
FIG. 22 is a diagram for explaining a problem that occurs when the LD bars shown in FIGS. 20A and 20B are arranged for forming a coating film thereon.

FIGS. 18A, 18B, 19A, and 19B are diagrams for explaining a modification of the above embodiment. In this modification, the projection portions are formed in a process that is independent of the process of forming the electrode. FIGS. 18A and 19A are diagrams showing one of the semiconductor laser regions A, as viewed from the insulating film 16 side. FIG. 18B is a cross-sectional view taken along line VIII-VIII in FIG. 18A. FIG. 19B is a cross-sectional view taken along line IX-IX in FIG. 19A.

In this modification, an insulating film 16 that is thicker than that in the above embodiment is formed in the step S11 for preparing the epitaxial wafer 10 shown in FIG. 2. For example, the insulating film 16 is composed of a dielectric material such as $SiO_2$ or SiN. The insulating film 16 may have a thickness of about 2 μm. Then, a patterned resist is formed only in areas of the insulating film 16 that are to become projection portions. Subsequently, the insulating film 16 is etched with the patterned resist as an etching mask by, for example, dry etching process such as RIE. After etching, the thickness of the insulating film 16 at the area without the resist mask is reduced up to, for example, 0.5 μm. The resist mask is then removed. Accordingly, as shown in FIGS. 18A and 18B, a projection portion 16b composed of a dielectric material such as $SiO_2$ or SiN is formed. The positions and the number of the projection portions 16b in each semiconductor laser region A are the same as those of the projection portions 22 in the above embodiment.

Next, as shown in FIGS. 19A and 19B, after forming the openings 16a in the insulating film 16, the stripe electrodes 18 and the bonding pads 20 (i.e., the base patterns 20a and the additional plating layers 20b) are formed. Subsequently, the steps of forming the groove, forming the LD bar, arranging the LD bar, and forming the coating-film are performed as in the above embodiment, whereby LD bars 30 with the coating films 32 formed on the side surfaces 30b and 30c of the LD bars 30 are obtained.

As in this modification, the projection portions may be composed of a dielectric material that is different from a metallic material. Even in this case, advantages similar to those of the above embodiment can be appropriately achieved. Although the projection portions are formed with the insulating film 16 composed of, for example, $SiO_2$ or SiN in this modification, the projection portions may alternatively be formed using resin such as polyimide resin or BCB (benzocyclobutene) resin.

The coating-film forming method for a semiconductor laser according to the present invention is not to be limited to the above embodiment, and permits other various modifications. For example, although two projection portions are formed in each semiconductor laser region in the above embodiment, the number of projection portions is not limited to this value. Furthermore, if the projection portions formed in each semiconductor laser region are located toward one side surface (end facet) of the corresponding LD bar, the bonding pads are preferably located toward the other side surface (end facet) of the LD bar. Thus, when the coating films are to be formed, the LD bars can be stably supported above the support surface.

Principles of the present invention have been described on the basis of preferred embodiments with reference to the drawings. However, those skilled in the art will understand that the embodiments can be changed in terms of details without departing from the principles. Therefore, all the modifications and changes within the scope and the spirit of Claims are claimed as the present invention.

What is claimed is:

1. A method for forming a coating film on a facet of a semiconductor optical device, the method comprising the steps of:

preparing an epitaxial wafer by forming a multilayer semiconductor structure including an active layer on a main surface of a substrate;

forming a plurality of stripe electrodes and a plurality of bonding pads on the multilayer semiconductor structure of the epitaxial wafer, the stripe electrodes extending longitudinally in a first direction and being arranged in a second direction that is perpendicular to the first direction, the bonding pads being respectively electrically connected to the stripe electrodes;

forming a projection portion on the multilayer semiconductor structure of the epitaxial wafer to have a height measured from the main surface of the substrate that is greater than a height of the stripe electrodes;

forming a plurality of laser diode bars by cutting the epitaxial wafer in the second direction;

arranging the laser diode bars on a support surface such that a side surface of at least one laser diode bar is oriented in a normal direction of the support surface, and disposing spacers between the laser diode bars; and forming a coating film on the side surface of the at least one laser diode bar, wherein, the at least one laser diode bar has at least one projection portion, and the at least one projection portion is formed a distance from the side surface of the at least one laser diode bar that is shorter than a distance between the side surface and the bonding pad.

2. The method for forming a coating film on a facet of a semiconductor optical device according to claim 1, wherein
the projection portion is formed simultaneously with the formation of the bonding pad, and
the projection portion and the bonding pad are composed of the same material.

3. The method for forming a coating film on a facet of a semiconductor optical device according to claim 1,
wherein the step of preparing an epitaxial wafer includes a step of forming an insulating film on the multilayer semiconductor structure, and
wherein the projection portion is formed by etching a portion of the insulating film and includes the insulating film.

4. The method for forming a coating film on a facet of a semiconductor optical device according to claim 1, wherein the projection portion has a height measured from the main surface of the substrate, the height of the projection portion being smaller than or equal to a height of the bonding pads measured from the main surface.

5. The method for forming a coating film on a facet of a semiconductor optical device according to claim 1, further comprising a step of forming a groove extending in the second direction in a back surface of the substrate,
wherein the step of forming the laser diode bars includes cutting the epitaxial wafer into segments along the groove.

6. The method for forming a coating film on a facet of a semiconductor optical device according to claim 5, wherein the groove has a depth of 30 μm or smaller.

7. The method for forming a coating film on a facet of a semiconductor optical device according to claim 5, wherein the distance of the projection portion from the side surface of the at least one laser diode bar is equal to a distance between the side surface of the at least one laser diode bar and a sidewall of the groove.

8. The method for forming a coating film on a facet of a semiconductor optical device according to claim 1, wherein one or more of the laser diode bars has a width smaller than or equal to 200 μm in a direction perpendicular to the second direction.

9. The method for forming a coating film on a facet of a semiconductor optical device according to claim 2, wherein the same material of the projection portion and the bonding pad is a metallic material.

10. A method for forming a coating film on a facet of a semiconductor optical device, the method comprising the steps of:
preparing an epitaxial wafer by forming a multilayer semiconductor structure including an active layer on a main surface of a substrate;

forming a plurality of stripe electrodes and a plurality of bonding pads on the multilayer semiconductor structure of the epitaxial wafer, the stripe electrodes extending longitudinally in a first direction and being arranged in a second direction that is perpendicular to the first direction, the bonding pads being respectively electrically connected to the stripe electrodes;

forming a projection portion on the multilayer semiconductor structure of the epitaxial wafer to have a height measured from the main surface of the substrate that is greater than a height of the stripe electrodes;

forming a plurality of laser diode bars by cutting the epitaxial wafer in the second direction;

arranging the laser diode bars on a support surface such that a side surface of at least one laser diode bar is oriented in a normal direction of the support surface, and disposing spacers between the laser diode bars; and forming a coating film on the side surface of the at least one laser diode bar, wherein, the at least one laser diode bar has at least one projection portion, and the at least one projection portion has a height measured from the main surface of the substrate that is less than a height of the bonding pads measured from the main surface.

11. A method for forming a coating film on a facet of a semiconductor optical device, the method comprising the steps of:
preparing an epitaxial wafer by forming a multilayer semiconductor structure including an active layer on a main surface of a substrate;

forming a plurality of stripe electrodes and a plurality of bonding pads on the multilayer semiconductor structure of the epitaxial wafer, the stripe electrodes extending longitudinally in a first direction and being arranged in a second direction that is perpendicular to the first direction, the bonding pads being respectively electrically connected to the stripe electrodes;

forming a projection portion on the multilayer semiconductor structure of the epitaxial wafer to have a height measured from the main surface of the substrate that is greater than a height of the stripe electrodes;

forming a groove extending in the second direction in a back surface of the substrate;

forming a plurality of laser diode bars by cutting the epitaxial wafer into segments in the second direction along the groove;

arranging the laser diode bars on a support surface such that a side surface of at least one laser diode bar is oriented in a normal direction of the support surface, and disposing spacers between the laser diode bars; and forming a coating film on the side surface of the at least one laser diode bar, wherein, the at least one laser diode bar has at least one projection portion, and the at least one projection portion is formed a distance from the side surface of the at least one laser diode bar that is shorter than a distance between the side surface and the bonding pad, and that is equal to a distance between the side surface of the at least one laser diode bar and a sidewall of the groove.

* * * * *